(12) United States Patent
Ichikiwa et al.

(10) Patent No.: US 8,039,835 B2
(45) Date of Patent: Oct. 18, 2011

(54) SEMICONDUCTOR DEVICE, METHOD FOR MANUFACTURING THE SAME, ELECTRO-OPTICAL DEVICE AND ELECTRONIC APPARATUS

(75) Inventors: Musubu Ichikiwa, Ueda (JP); Kiyoshi Nakamura, Suwa-gun (JP); Taketomi Kamikawa, Shiojiri (JP)

(73) Assignees: Shinshu University, National University Corporation, Matsumoto-shi (JP); Seiko Epson Corporation, Tokyo (JP)

( * ) Notice: Subject to any disclaimer, the term of this patent is extended or adjusted under 35 U.S.C. 154(b) by 382 days.

(21) Appl. No.: 11/957,012

(22) Filed: Dec. 14, 2007

(65) Prior Publication Data
US 2008/0173867 A1 Jul. 24, 2008

(30) Foreign Application Priority Data
Dec. 19, 2006 (JP) .................. 2006-341652

(51) Int. Cl.
*H01L 29/12* (2006.01)
(52) U.S. Cl. .......... 257/43; 438/445; 257/349; 257/191; 257/435
(58) Field of Classification Search .......... 257/43, 257/191, 349, 435; 438/445
See application file for complete search history.

(56) References Cited

U.S. PATENT DOCUMENTS

| 5,418,391 | A  | * | 5/1995 | Huang ........................... 257/336 |
| 5,599,728 | A  | * | 2/1997 | Hu et al. ........................ 438/289 |
| 7,339,187 | B2 | * | 3/2008 | Wager et al. ..................... 257/43 |
| 2007/0215957 | A1 | * | 9/2007 | Chen et al. ..................... 257/411 |

FOREIGN PATENT DOCUMENTS

| JP | 2000058837 A | * | 2/2000 |
| JP | A-2000-58837 |   | 2/2000 |
| JP | A-2000-277537 |  | 10/2000 |

OTHER PUBLICATIONS

B. Yaglioglu et al., "High-mobility amorphous $In_2O_3$-10wt %ZnO thin film transistors", Applied Physics Letters 89, 062103-1, Aug. 7, 2006, American Institute of Physics.

* cited by examiner

*Primary Examiner* — Kenneth Parker
*Assistant Examiner* — Dale E Page
(74) *Attorney, Agent, or Firm* — Oliff & Berridge, PLC

(57) ABSTRACT

A semiconductor device includes a substrate, a transparent oxide layer disposed on one surface side of the substrate, a gate disposed apart from the transparent oxide layer, and a gate insulating layer disposed between the transparent oxide layer and the gate. The transparent oxide layer includes a source, a drain, and a channel formed integrally between the source and the drain, and is made of a transparent oxide material as the main material. The gate provides an electric field to the channel. The gate insulating layer insulates the source and the drain from the gate. The average thickness of the channel is smaller than the average thickness of the source and the drain so that the source and the drain function as conductors and the channel functions as a semiconductor.

16 Claims, 10 Drawing Sheets

SEMICONDUCTOR DEVICE, METHOD FOR MANUFACTURING THE SAME, ELECTRO-OPTICAL DEVICE AND ELECTRONIC APPARATUS

The entire disclosure of Japanese Patent Application No. 2006-341652, filed Dec. 19, 2006 is expressly incorporated by reference herein.

BACKGROUND

1. Technical Field

The present invention relates to a semiconductor device, a method for manufacturing the same, an electro-optical device and an electronic apparatus.

2. Related Art

Semiconductor devices such as transistors are broadly used for electronic apparatuses such as televisions.

Many semiconductor materials for use in semiconductor devices have been known.

For example, JP-A-2000-277537 discloses a semiconductor film made of inorganic materials such as a zinc oxide.

These materials are semiconductors, and therefore cannot be used as electrodes that are required to be conductive.

Accordingly, in a semiconductor device such as a transistor, a metal material is generally used for an electrode and the foregoing material is used as a semiconductor material.

However, if the material used for a semiconductor differs from that used for an electrode, there are problems in that the matching of both materials needs to be considered, and that a large number of manufacturing processes is required.

SUMMARY

An advantage of the invention is to provide a semiconductor device having a transparent oxide layer in which a source, a drain, and a channel are integrally formed of a transparent oxide material, a method for manufacturing the same, and an electro-optical device and an electronic apparatus that have such a semiconductor device.

Such an advantage is achieved by some aspects of the invention described below.

A semiconductor device according to a first aspect of the invention includes a substrate, a transparent oxide layer disposed on one surface side of the substrate, a gate disposed apart from the transparent oxide layer, and a gate insulating layer disposed between the transparent oxide layer and the gate.

The transparent oxide layer includes a source, a drain, and a channel formed integrally between the source and the drain, and is made of a transparent oxide material as the main material.

The gate provides an electric field to the channel.

The gate insulating layer insulates the source and the drain from the gate.

The average thickness of the source and the drain is smaller than the average thickness of the channel so that the source and the drain function as conductors and the channel functions as a semiconductor.

Thus, it is possible to achieve the semiconductor device in which the source, the drain, and the channel are integrally formed in the transparent oxide layer without the need for consideration to matching between an electrode material and a semiconductor material.

In the semiconductor device according to the first aspect of the invention, it is preferable that A/B be from 2.5 to 4000, where the average thickness of the source and the drain is A [nm] and the average thickness of the channel is B [nm].

Thus, the channel has semiconductor characteristics, allowing achievement of the semiconductor device in which the source, drain, and channel having excellent characteristics are integrally formed in the transparent oxide layer.

In the semiconductor device according to the first aspect of the invention, it is preferable that the source and the drain have an average thickness of 50 nm or more.

Thus, the source and the drain remarkably exhibit conductivity, allowing achievement of the semiconductor device in which the source, drain, and channel having excellent characteristics are integrally formed in the transparent oxide layer.

In the semiconductor device according to the first aspect of the invention, it is preferable that a distance between the source and the drain be from 0.1 to 100 μM.

Thus, carriers efficiently flow, allowing achievement of the semiconductor device in which the source, drain, and channel having excellent characteristics are integrally formed in the transparent oxide layer.

In the semiconductor device according to the first aspect of the invention, it is preferable that the channel have an average thickness of from 0.5 to 20 nm.

Thus, the channel remarkably exhibits semiconductor characteristics, allowing achievement of the semiconductor device in which the source, drain, and channel having excellent characteristics are integrally formed in the transparent oxide layer.

In the semiconductor device according to the first aspect of the invention, it is preferable that a thickness of the channel decrease toward a central part between the source and the drain.

Thus, the channel more reliably exhibits semiconductor characteristics, allowing achievement of the semiconductor device in which the source, drain, and channel having excellent characteristics are integrally formed in the transparent oxide layer.

In the semiconductor device according to the first aspect of the invention, it is preferable that the channel have a first surface facing the substrate and a second surface opposing the first surface and the second surface be curved and concave.

Thus, the channel still more reliably exhibits semiconductor characteristics, allowing achievement of the semiconductor device in which the source, drain, and channel having excellent characteristics are integrally formed in the transparent oxide layer.

In the semiconductor device according to the first aspect of the invention, it is preferable that the transparent oxide material be a metal complex oxide.

Thus, it is possible to achieve the semiconductor device in which the source, drain, and channel having excellent characteristics are integrally formed in the transparent oxide layer without the need for consideration to matching between an electrode material and a semiconductor material.

In the semiconductor device according to the first aspect of the invention, it is preferable that the metal complex oxide be a complex oxide containing indium.

Thus, it is possible to achieve the semiconductor device in which the source, drain, and channel having more excellent characteristics are integrally formed in the transparent oxide layer without the need for consideration to matching between an electrode material and a semiconductor material.

In the semiconductor device according to the first aspect of the invention, it is preferable that the complex oxide containing indium have at least one of an indium tin complex oxide and an indium zinc complex oxide as the main component.

Thus, it is possible to achieve the semiconductor device in which the source, drain, and channel having still more excellent characteristics are integrally formed in the transparent oxide layer without the need for consideration to matching between an electrode material and a semiconductor material.

In the semiconductor device according to the first aspect of the invention, it is preferable that the transparent oxide layer have a third surface facing the substrate and a fourth surface opposing the third surface, and the fourth surface be a continuous surface.

Thus, it is possible to achieve the semiconductor device in which the source, drain, and channel are integrally formed in the transparent oxide layer without the need for consideration to matching between an electrode material and a semiconductor material.

A method for manufacturing the semiconductor device according to a second aspect of the invention includes: (a) placing a mask having a first opening corresponding to the source and a second opening corresponding to the drain on one surface of the substrate; and (b) supplying the transparent oxide material from a side that faces the substrate and is adjacent to the mask to form a film.

In the step (b), the source and the drain are formed and the transparent oxide material is reliably introduced in to an area directly under a partition separating the first opening from the second opening and covered with the partition to form the channel integrally with the source and the drain to obtain the transparent oxide layer.

Thus, it is possible to obtain a thin portion of the transparent oxide layer, that is, the channel into which the transparent oxide material is reliably introduced, and to easily achieve the semiconductor device in which the source, drain, and channel are integrally formed in the transparent oxide layer without the need for consideration to matching between an electrode material and a semiconductor material.

In the method for manufacturing the semiconductor device according to the second aspect of the invention, it is preferable that the partition have roundness in a portion thereof facing the substrate.

Thus, it is possible to efficiently obtain the thin channel into which the transparent oxide material is reliably introduced, and to easily achieve the semiconductor device in which the source, drain, and channel are integrally formed in the transparent oxide layer.

In the method for manufacturing the semiconductor device according to the second aspect of the invention, it is preferable that the mask include a plate having an opening, and a bar provided to partition the opening into the first opening and the second opening.

Thus, it is possible to reliably obtain the thin channel into which the transparent oxide material is reliably introduced, and to easily achieve the semiconductor device in which the source, drain, and channel are integrally formed in the transparent oxide layer.

In the method for manufacturing the semiconductor device according to the second aspect of the invention, it is preferable that the plate include recesses in edges of the opening, each recess receiving each end of the bar.

Thus, it is possible to obtain the thin channel to which the transparent oxide material is more reliably introduced, and to easily achieve the semiconductor device in which the source, drain, and channel are integrally formed in the transparent oxide layer.

An electro-optical device according to a third aspect of the invention includes the semiconductor device according to the first aspect of the invention.

Thus, it is possible to easily achieve the electro-optical device that includes the semiconductor device having excellent characteristics.

An electronic apparatus according to a fourth aspect of the invention includes the electro-optical device according to the third aspect of the invention.

Thus, it is possible to easily achieve the electronic apparatus that includes the electro-optical device having excellent characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a semiconductor device, a manufacturing method therefor, an electro-optical device, and an electronic apparatus according to the invention will be described below with reference to the accompanying drawings.

First Embodiment

First, a first embodiment of a semiconductor device and a manufacturing method therefor of the invention will be described.

(1) Semiconductor Device

Figure 1:
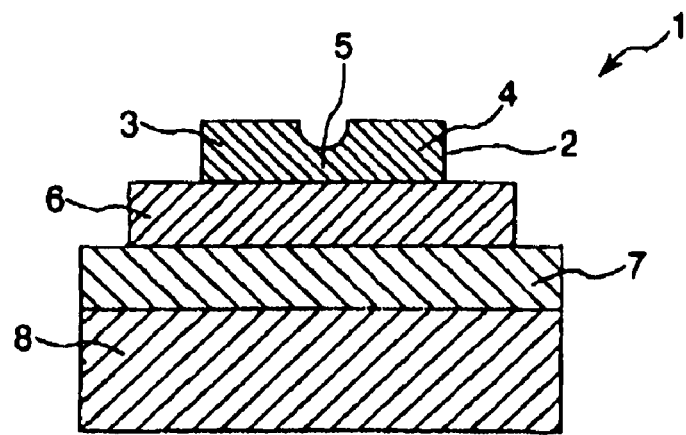
FIG. 1 is a longitudinal sectional view schematically illustrating a first embodiment of a semiconductor device of the invention.

FIG. 1 illustrates one embodiment of the invention, and is a schematic longitudinal sectional view of a semiconductor device 1.

Note that, in the following description, the upper side and the lower side in FIG. 1 are referred to as "upper" and "lower", respectively.

The semiconductor device 1 illustrated in FIG. 1 includes a transparent oxide layer 2 in which a source 3, a drain 4, and a channel 5 are integrated, a gate insulating layer 6, a gate 7, and a substrate 8.

Hereinbelow, the configuration of each element will be described sequentially.

The transparent oxide layer 2 is disposed on one surface side of the substrate 8 and is formed of a transparent oxide material as the main material.

In the transparent oxide layer 2, the film thickness of the central part is larger than that of the both ends (right and left ends in FIG. 1).

Due to the difference in film thickness (average thickness), the both ends constitute the source 3 and the drain 4, respectively, functioning as conductors, and the central part constitutes the channel 5 functioning as a semiconductor.

Here, the present inventor has devoted himself to studies on a transparent oxide material that is generally used as an electrode material (conductive material).

The accumulation of studies has led to finding that a layer made of a transparent oxide material exhibits semiconductor properties as the thickness of the layer decreases.

The inventor has thus completed the invention.

With such a configuration, carriers (electrons and holes) are smoothly transferred between the source 3 and drain 4 and the channel 5.

This allows the semiconductor device 1 excellent in characteristics to be achieved.

As described above, the average thickness of the channel 5 is smaller than that of the source 3 and drain 4.

The relationship between the average thickness of the source 3 and drain 4 and that of the channel 5 is as follows, where the average thickness of the source 3 and drain 4 is A [nm], and the average thickness of the channel 5 is B [nm].

A/B is preferably from 2.5 to 4000, and more preferably from 5 to 2000.

This relationship allows achievement of the semiconductor device 1 in which the channel 5 having excellent semiconductor characteristics and the source 3 and drain 4 having excellent conductivity are integrally formed.

The specific value of the average thickness of the source 3 and drain 4 is preferably from 50 to 2000 nm, and more preferably from 50 to 1000 nm.

As a result, the transparent oxide material remarkably exhibits conductivity.

This allows the transparent oxide material to be used as an electrode.

The distance between the source 3 and the drain 4 is preferably from 0.1 to 100 µm, and more preferably from 0.5 to 50 µm.

This allows achievement of the semiconductor device 1 in which carriers efficiently flow and that has excellent characteristics.

The specific value of the average thickness of the channel 5 is preferably from 0.5 to 20 nm, more preferably from 1 to 10 nm, and most preferably from 1 to 5 nm.

This allows achievement of the channel 5 having excellent semiconductor characteristics.

It is also preferable that the thickness of the channel 5 decreases toward the central part between the source 3 and the drain 4 (in a direction from either one of the source 3 and the drain 4 to the other) as illustrated in FIG. 1.

This allows more reliable achievement of the semiconductor device 1 in which the channel 5 having excellent semiconductor characteristics and the source 3 and drain 4 having excellent conductivity are integrally formed.

Further, the channel 5 is preferably made such that a surface thereof opposing the substrate 8 is curved and concave as illustrated in FIG. 1.

This allows still more reliable achievement of the semiconductor device 1 in which the channel 5 having excellent semiconductor characteristics and the source 3 and the drain 4 having excellent conductivity are integrally formed.

Examples of transparent oxide materials include metal oxides such as a zinc oxide, a tin oxide, an indium oxide, and a gallium oxide; and metal complex oxides such as an indium tin complex oxide (hereinafter abbreviated as "ITO"), an indium zinc complex oxide (izo), an aluminum zinc complex oxide (AZO) and a gallium zinc complex oxide (GZO).

One kind of the above-listed materials may be used alone, or two or more kinds of the materials may be used in combination.

Among these materials, the metal complex oxide is preferable, the complex oxide containing indium is more preferable, and ITO and IZO are most preferable.

Such materials allow easy achievement of the semiconductor device 1 having excellent characteristics without the need for consideration of matching with the material of the channel 5.

If the transparent oxide layer 2 has these transparent oxide materials as the main material, it may contain any substances and materials other than the main material unless they affect the characteristics of the semiconductor device 1.

The source 3, the drain 4, and the channel 5 may be made of the same foregoing compound or may be made of different compounds, but the same compound is preferable.

This allows easy achievement of the semiconductor device 1.

In the transparent oxide layer 2 as described above, the surface thereof opposing the substrate 8 is preferably a continuous surface as illustrated in FIG. 1.

This surface allows achievement of the semiconductor device 1 in which the source 3, the drain 4, and the channel 5 are integrally formed without the need for consideration of matching between the electrode material and the semiconductor material.

Note that if the transparent oxide layer 2 is a continuous surface, its shape does not matter.

The rate insulating layer 6 is for the purpose of insulating the source 3 and the drain 4 from the gate 7 to be described later, and is disposed between the transparent oxide layer 2 and the gate 7 and in contact with both thereof.

Such the gate insulating layer 6 is made of an insulating material.

The kind of the insulating material is not particularly limited if it is publicly known.

Mentioned as the insulating material are inorganic materials including inorganic oxides such as a silicon oxide, an aluminum oxide, a zirconium oxide, a cerium oxide, a zinc oxide, a cobalt oxide, a lead zirconate titanate, a lead titanate, a titanium oxide, and a tantalum oxide, and inorganic nitrides such as a silicon nitride, an aluminum nitride, a zirconium nitride, a cerium nitride, a zinc nitride, a cobalt nitride, a titanium nitride, and a tantalum nitride; and organic materials such as polymethyl methacrylate, polyvinylphenol, polyimide, polystyrene, polyvinyl alcohol, and polyvinyl acetate.

One kind of the above-listed materials may be used alone, or two or more kinds of the materials may be used in combination.

Among these materials, the inorganic oxide is particularly preferable, and the silicon oxide is more preferable.

Such materials can enhance the insulating properties.

The average thickness of the gate insulating layer 6 is not particularly limited, but is preferably from 10 to 1000 nm, and more preferably from 100 to 500 nm.

Such average thicknesses allow reduction of the operating voltage of the semiconductor device 1.

The gate 7 is for the purpose of providing an electric field to the channel 5, and is disposed between the gate insulating layer 6 and the substrate 8 and in contact with both thereof.

In other words, the gate 7 is disposed such that the gate 7 is not in contact with (apart from) the transparent oxide layer 2.

Such the gate 7 is made of a conductive material, and any publicly-known materials may be used.

For example, the same materials as those described for the transparent oxide layer 2, metal materials including metals such as Cr, Al, Ta, Mo, Nb, Cu, Ag, Au, Pd, In, Ni, Nd, Co, Zn, Sn, and Ga, and alloys containing these metals, and oxides of these metal materials may be used.

The average thickness of the gate 7 is not particularly limited, but is preferably from about 0.1 to about 2000 nm, and more preferably from about 1 to about 1000 nm.

The substrate 8 supports layers (parts) constituting the semiconductor device 1.

For example, plastic substrates (resin substrates) made of polyethylene terephthalate (PET), polyethylene naphthalate (PEN), polyether sulfone (PES), aromatic polyester (liquid crystal polymer), polyimide (PI), and the like, glass substrates, quartz substrates, silicon substrates, metal substrates, and gallium arsenide substrates may be used.

In the case of providing flexibility to the semiconductor device 1, a plastic substrate or a thin (having a relatively small film thickness) metal substrate is selected as the substrate 8.

The semiconductor device 1 as described above is preferably used, e.g., for transistors such as a thin film transistor, a transparent transistor, a transparent field effect transistor (FET), an organic light-emitting FET, and a static induction transistor; and integrated transistors.

(2) Manufacturing Method for Semiconductor Device

Next, a manufacturing method for the semiconductor device 1 will be described.

The semiconductor device 1 described above can be manufactured in the following method.

A method for manufacturing the semiconductor device 1 illustrated in FIG. 1 includes [A1] forming the gate 7 on the substrate 8, [A2] forming the gate insulating layer 6 on the gate 7, and [A3] forming the transparent oxide layer 2 on the gate insulating layer 6.

[A1] Forming Gate

First, a transparent oxide such as an ITO is deposited to form a layer over the substrate 8.

This layer can be formed by vacuum film formation methods such as sputtering; chemical vapor deposition (CVD) methods such as a plasma CVD method, a thermal CVD method, and a laser CVD method; vacuum deposition; dry plating methods such as ion plating; wet plating methods such as electrolytic plating, immersion plating, and electroless plating; spraying; a sol-gel method; a metal organic deposition (MOD) method; sheet material junction; and the like.

A substrate with a film of a transparent oxide such as an ITO may also be used.

[A2] Forming Gate Insulating Layer

Next, an insulating material such as a silicon oxide is deposited over the gate 7.

In the case of making the gate insulating layer 6 of an inorganic material, the gate insulating layer 6 can be formed, e.g., by a thermal CVD method, a CVD method, and a spin-on-glass (SOG) method.

Use of polysilazane as the material enables a silica film or a silicon nitride film as the gate insulating layer 6 to be formed by a wet process.

In the case of making the gate insulating layer 6 of an organic material, a liquid material containing an organic material or its precursor is applied onto the gate 7 in such a manner as to coat the gate 7 and then a post-treatment is applied (e.g., heating, infrared radiation, and applying ultrasonic waves) to the coated film as necessary, allowing the gate insulating layer 6 to be formed.

As the method of applying a liquid material containing an organic material or its precursor, coating methods such as spin coating and dip coating and printing methods such as an inkjet method and a screen method may be used.

[A3] Forming Transparent Oxide Layer

Next, the transparent oxide layer 2 made using a transparent oxide material as the main material is formed on the gate insulating layer 6.

The processes are the feature of the invention, and therefore will be described in detail below with reference to the accompanying drawings.

(a) First Process

This process is one in which a mask 9 having a first opening 11a corresponding to the source 3 and a second opening 11b corresponding to the drain 4 is placed on one surface of the substrate 8.

Figure 2:
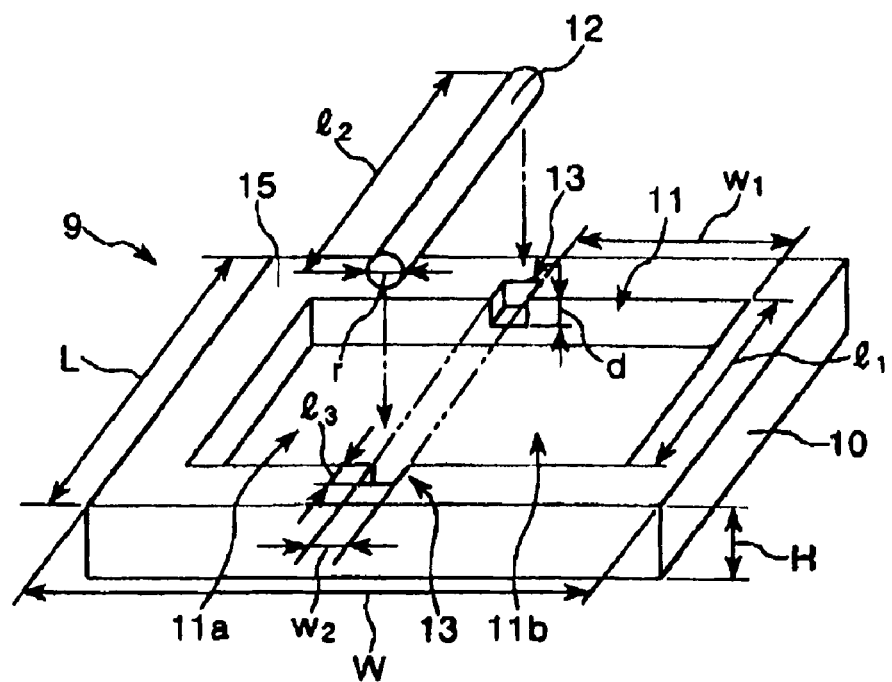
FIG. 2 is a perspective view illustrating the structure of a mask used in a manufacturing method for a semiconductor device of one embodiment of the Invention.

Here, the structure of the mask 9 used in one embodiment of the invention is illustrated in FIG. 2.

The mask 9 illustrated in FIG. 2 has a plate (body of the mask) 10 with an opening 11 and a bar 12 provided in such a manner as to traverse the opening 11.

In the plate 10, a pair of recesses 13 is formed at positions facing each other in edges of the opening 11.

Each of both ends of the bar 12 is received in each recess 13, thereby attaching the bar 12 to the plate 10.

By the bar 12, the opening 11 is divided into two openings 11a and 11b. That is, part of the bar 12 exposed in the opening 11 constitutes a partition that partitions the opening 11 into the opening 11a and the opening 11b.

Using such the mask 9 and setting conditions in film formation allow the source 3 and the drain 4 to be formed at the positions corresponding to the openings 11a and 11b, and also allow the extremely thin channel 5 to be formed in an area directly under the bar 12 (partition) because of the effect of introducing a transparent oxide material (film material) in a roundabout way (hereinafter, referred to as a "roundabout effect") in forming the transparent oxide layer 2.

As the material of the plate 10, e.g., metal such as aluminum and silicon are mentioned, and preferably metal is used.

The plate 10 is rectangular, and its size varies depending on the size of a portion to be masked.

For example, it is preferable that the length L be from 10 to 50 mm, the width UV be from 10 to 50 mm, and the thickness H be from 0.5 to 5 mm.

These sizes allow the gate insulating layer 6 and the gate 7 to be appropriately masked.

The opening 11 is substantially square or rectangular as viewed from a plane.

The shape of each opening 11a or 11b is rectangular by partitioning with the bar 12.

This allows formation of the transparent oxide layer 2 having a shape excellent in convenience.

The sizes of the openings 11a and 11b are set depending on the sizes of the source 3 and the drain 4 to be formed, and are not particularly limited.

For example, however, it is preferable that the length $l_1$ be from 1 to 30 mm, and the width $w_1$ be from 1 to 30 mm. This allows the transparent oxide layer 2 to be appropriately deposited on the gate insulating layer 6.

The positions of the opening 11a and 11b are preferably in the center of the plate 10.

This allows masking to be performed appropriately.

Examples of the material for the bar 12 include metal such as aluminum and silicon.

The material is preferably the same as used for the plate 10, and more preferably metal.

This prevents distortion caused by a difference in thermal expansion coefficient between the plate 10 and the bar 12.

The roundabout effect of the transparent oxide material can be efficiently exerted in an area directly under the bar 12.

The shape of the bar 12 is preferably one having roundness in a portion of the bar 12 on a side near the substrate 8, and more preferably cylindrical.

This makes it possible to efficiently exert the roundabout effect of a transparent oxide material to form the channel 5 in an area directly under the bar 12.

The width (diameter) r of the bar 12 is set in accordance with the distance between the source 3 and the drain 4.

The width r is preferably from 5 to 200 μm, and more preferably from 10 to 100 μm.

The length $l_2$ of the bar 12 is set to be larger than the length $l_1$ of the opening 11a or 11b.

The length $l_2$ is preferably from 2 to 48 mm, and more preferably from 5 to 32 mm.

This makes it possible to efficiently exert the roundabout effect of a transparent oxide material to form the channel 5 having an appropriate size with accuracy in size in an area directly under the bar 12.

The bar 12 is provided to partition the opening 11 into the openings 11a and 11b having substantially the same size.

As a result, the source 3 and the drain 4 having substantially the same size can be formed.

The bar 12 is positioned on the contact side (side portion of the upper surface in FIG. 2) with the gate insulating layer 6 of the plate 10.

In this case, the bar 12 is preferably shifted from the contact surface 15 by the thickness of the channel 5 to be for med.

This makes it possible to efficiently exert the roundabout effect of a transparent oxide material in an area directly under the bar 12.

Both ends of the bar 12 are inserted (received) and fixed in the recesses 13 formed in the edges of the opening 11 of the plate 10.

Examples of a method for fixing the bar 12 to the recesses 13 include fitting, fusing, and bonding by adhesive.

Among these methods, fitting is preferable.

Such a method makes it possible to remove the bar 12 from the plate 10 and use the plate 10 as a mask having one opening 11.

In this case, the width $w_2$ of the recess 13 (the length in the horizontal direction in FIG. 2) is set slightly smaller than the width r of the bar 12.

The depth d of the recess 13 (the length in the vertical direction in FIG. 2) is set larger than the width r of the bar 12 by the average thickness of the channel 5 to be formed.

The length $l_3$ of the recess 13 (the length in the longitudinal direction of the paper space in FIG. 2) is set depending on the lengthy $l_1$ of the opening 11a or 11b and the length $l_2$ of the bar 12.

Regarding the specific sizes of the recess 13, a length 13 of 200 to 5000 μm, a width $w_2$ of 5 to 200 μm, and a depth d of 5 to 200 μm are preferable, and a length $l_3$ of 500 to 2000 μm, a width $w_2$ of 10 to 100 μm, and a depth d of 10 to 100 μm are more preferable.

This allows the bar 12 to be received with reliability, leading to reliable exertion of the roundabout effect of a transparent oxide material.

Note that each recess 13 is disposed substantially at the center of an edge in the width direction (the horizontal direction in FIG. 2) of the opening 11.

As a result, the opening 11 is divided into the openings 11a and 11b having substantially the same size by the bar 12 as described above.

The edge of the recess 13 is square U-shaped as viewed from the opening 11 in the structure illustrated in the figure, but is not limited to this.

For example, the edge may be U-shaped.

The recess 13 may also have a structure of being not open to the contact surface 15.

That is, the recess 13 may be formed of a hole depressed from a surface facing the opening 11.

Further, the recess 13 may be one that has a depth reaching the vicinity of the opposite surface to the contact surface 15, and may also be formed of a groove that is open to the opposite surface to the contact surface 15.

In this case, the partition may be formed of a long plate instead of the bar 12.

The mask 9 is composed of two members, the plate 10 and the bar 12, in the structure illustrated in the figure, but these members may be integrally formed.

The method for placing the foregoing mask 9 is not particularly limited, and any one of publicly known methods may be used.

The placed mask 9 may be pressure-bonded to the gate insulating layer 6, but is preferably not pressure-bonded.

This causes a state where the mask 9 is in light contact with the gate insulating layer 6.

As a result, it is possible to exert the roundabout effect of a transparent oxide material in an area directly under the bar 12 to obtain an extremely thin channel 5.

(b) Second Process

This process is one in which a transparent oxide material is supplied from a side facing the substrate 8 and adjacent to the mask 9 to form a film.

The method for forming the transparent oxide layer 2 is not particularly limited, and any one of publicly known methods may be used.

Figure 3:
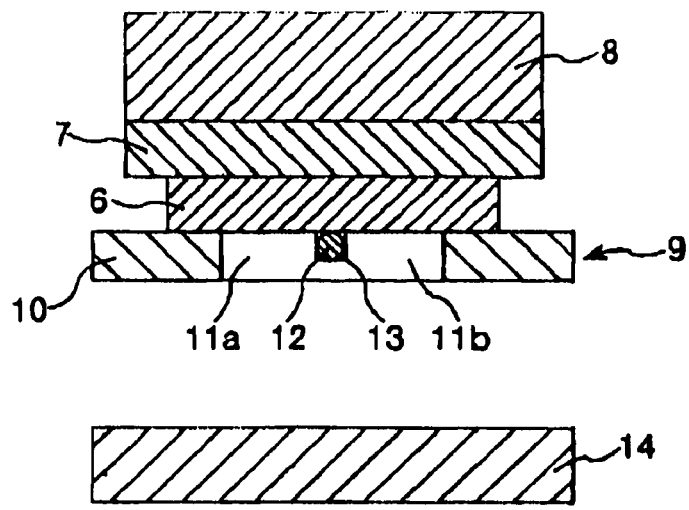
FIG. 3 is a longitudinal sectional view illustrating a manufacturing method for the semiconductor device in FIG. 1.

For example, the layer can be formed by a vacuum film formation method such as sputtering as illustrated in FIG. 3.

That is, in this method, a voltage is applied between a device having the gate insulating layer 6 coated with the mask 9 and a sputter target 14 in a vacuum state (depressurized state) to cause electrons and ions to impinge the sputter target 14, so that the flicked IZO is adhered onto the gate insulating layer 6.

At this point, the source 3 is formed in the opening 11a and the drain 4 is formed in the opening 11b with the bar 12 functioning as the boundary between both openings.

Further, the sputtered transparent oxide material is introduced in a roundabout way to an area directly under the bar 12 to form the extremely thin channel 5.

Therefore, the source 3, the drain 4, and the channel 5 are integrally formed at one time.

Thus, the semiconductor device 1 in which the source 3, the drain 4, and the channel 5 are integrally formed of a transparent oxide material can be easily obtained without the need for consideration of matching with materials of the channel 5.

In the formed transparent oxide layer 2, the channel 5 is formed by introducing a material in a roundabout way in an area directly under the bar 12, and the source 3 and the drain 4 are formed using the bar 12 as the boundary.

The sputtering time is preferably from 5 to 20 minutes, and more preferably from 10 to 15 minutes.

The distance between the sputter target 14 and the mask 9 is preferably from 5 to 20 cm, and more preferably from 7 to 15 cm.

The temperature of the substrate 8 is preferably from room temperature (20° C.) to 300° C., and more preferably from 50 to 250° C.

In sputtering, a film is formed in an atmosphere of gas such as argon or oxygen.

At this point, the argon flow rate is preferably from 50 to 200 sccm, and more preferably from 100 to 150 sccm.

The oxygen flow rate is preferably from 0.1 to 2 sccm, and more preferably from 0.2 to 1 sccm.

Setting the conditions as mentioned above allows the transparent oxide layer 2 having the aforementioned average thickness to be formed.

The layer can be formed by, in addition to the above-mentioned example, CVD methods such as a plasma CVD method, a thermal CVD method, and a laser CVD method; vacuum deposition; dry plating methods such as ion plating; wet plating methods such as electrolytic plating, immersion plating, and electroless plating; spraying; a sol-gel method; and an MOD method.

Among these methods, sputtering is preferable.

This makes it possible to efficiently obtain the roundabout effect of a transparent oxide material to form the extremely thin channel 5.

By a manufacturing method including the processes as described above, the semiconductor device 1 in which the source 3, the drain 4, and the channel 5 are integrally formed of a transparent oxide material can be easily obtained.

Second Embodiment

Next, a second embodiment of the semiconductor device 1 and a manufacturing method therefor of the invention will be described.

Regarding the second embodiment of the semiconductor device 1 and the manufacturing method therefor of the invention, description will be made mainly for the differences from the foregoing first embodiment, and description on the same points as in the first embodiment will be omitted.

(1) Semiconductor Device

Figure 4:
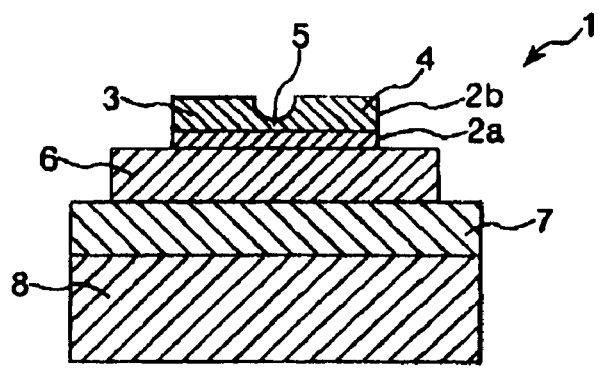
FIG. 4 is a longitudinal sectional view schematically illustrating a second embodiment of the semiconductor device of the invention.
Figure 5:
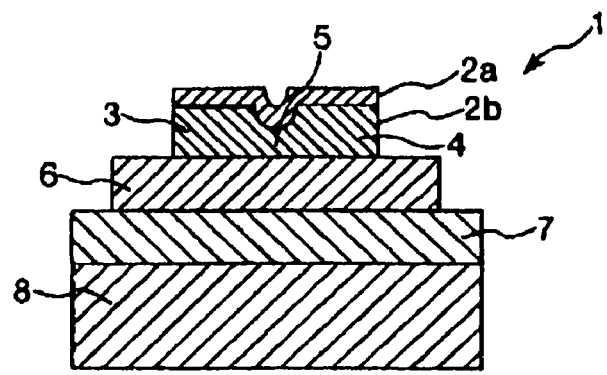
FIG. 5 is a longitudinal sectional view schematically illustrating the second embodiment of the semiconductor device of the invention.

FIGS. 4 and 5 illustrate one embodiment of the invention, and are schematic longitudinal sectional views of the semiconductor devices 1.

Note that, in the following description, the upper side and the lower side in FIGS. 4 and 5 are referred to as "upper" and "lower", respectively.

The semiconductor devices 1 illustrated in FIGS. 4 and 5 differ from the semiconductor device 1 of the first embodiment in the structure of a transparent oxide layer, and are the same as the semiconductor device 1 of the first embodiment in the other points.

That is, the semiconductor device 1 illustrated in FIG. 4 is formed by forming a transparent oxide layer 2a having the same thickness on the gate insulating layer 6 and then forming a transparent oxide layer 2b integrally having the source 3, the drain 4, and the channel 5.

On the other hand, the semiconductor device 1 illustrated in FIG. 5 is formed by forming the transparent oxide layer 2b integrally having the source 3, the drain 4, and the channel 5, and then forming the transparent oxide layer 2a having the same thickness.

(2) Manufacturing Method for Semiconductor Device

The semiconductor device 1 as mentioned above can be manufactured in the following way.

A method for manufacturing the semiconductor device 1 illustrated in FIGS. 4 and 5 includes [B1] forming the gate 7 on the substrate 8, [B2] forming the gate insulating layer 6 on the gate 7, and [B3] forming the transparent oxide layers 2a and 2b on the gate insulating layer 6.

[B1] Forming Gate

This process is the same as that described in the first embodiment.

[B2] Forming Gate Insulating Layer

This process is the same as that described in the first embodiment.

[B3] Forming Transparent Oxide Layer (a) Case of Semiconductor Device in FIG. 4

In this method, the mask 9 without the bar 12 is placed on the gate insulating layer 6 and the transparent oxide layer 2a is formed by sputtering such that a desired thickness is obtained by managing time.

Then, the transparent oxide layer 2b is formed by using the mask 9 having the bar 12 in the same way as in the first embodiment.

The present embodiment has the transparent oxide layers 9a and 2b, and therefore the channel 5 preferably exhibits the semiconductor characteristics.

That is, it is preferable to control the thickness of the transparent oxide layer 2a in accordance with the sputtering time so that the total thickness of the channel 5 and the transparent oxide layer 2a equals to the average thickness of the channel 5.

This allows the channel 5 to obtain the semiconductor characteristics even though the transparent oxide layers 2a and 2b are integrated.

Note that substances that differ from each other may be used as the transparent oxide materials contained in two transparent oxide layers 2a and 2b.

In this case, it is possible to obtain the semiconductor device 1 having excellent characteristics.

(b) Case of Semiconductor Device in FIG. 5

In this method, the transparent oxide layer 2b is formed by using the mask 9 with the bar 12 on the gate insulating layer 6 in the same way as in the first embodiment.

Then, the mask 9 without the bar 12 is placed and the transparent oxide layer 2a is formed by sputtering such that a desired thickness is obtained by managing time.

The present embodiment has the transparent oxide layers 2a and 2b, and therefore the channel 5 preferably exhibits the semiconductor characteristics.

That is, it is preferable to control the thickness of the transparent oxide layer 2a in accordance with the sputtering time so that the total thickness of the channel 5 and the transparent oxide layer 2a equals to the average thickness of the channel 5.

This allows the channel 5 to obtain the semiconductor characteristics even though the transparent oxide layers 2a and 2b are integrated.

Note that substances that differ from each other may be used as the transparent oxide materials contained in two transparent oxide layers 2a and 2b.

In this case, it is possible to obtain the semiconductor device 1 having excellent characteristics.

By a manufacturing method including the processes as described above, the semiconductor device 1 in which the source 3, the drain 4, and the channel 5 are integrally formed of a transparent oxide material can be easily obtained.

Electro-Optical Device

Next, an electro-optical device having a semiconductor device of one embodiment of the invention will be described.

Examples of the electro-optical device of one embodiment of the invention include liquid crystal devices such as a liquid crystal display, organic electroluminescent (EL) devices such as an organic EL display, electrophoretic displays, and printer heads.

An electro-optical device having a semiconductor device of one embodiment of the invention and a manufacturing method therefor will be described taking an electrophoretic display as an example.

(1) Electrophoretic Display

Figure 6:
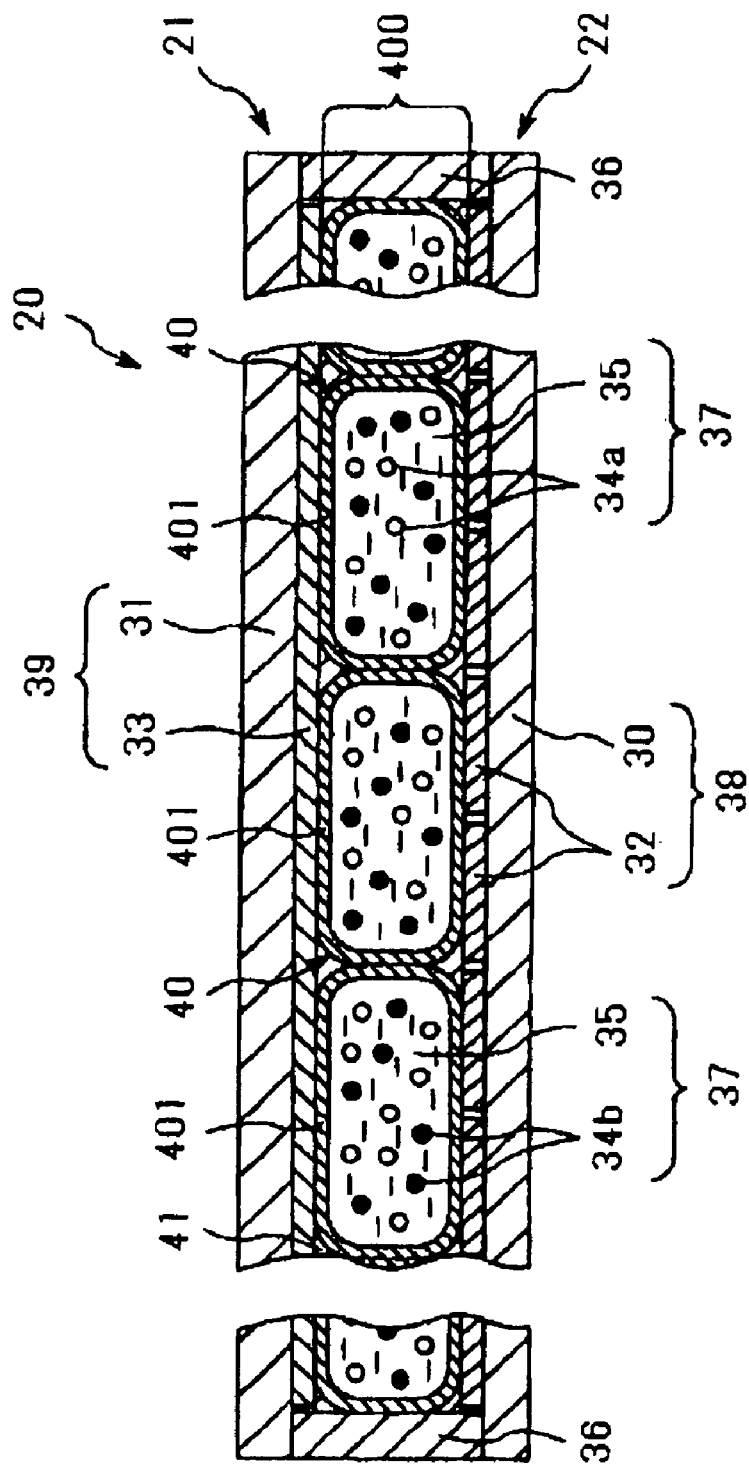
FIG. 6 schematically illustrates an electrophoretic display that is an embodiment of an electro-optical device of the invention.
Figure 7:
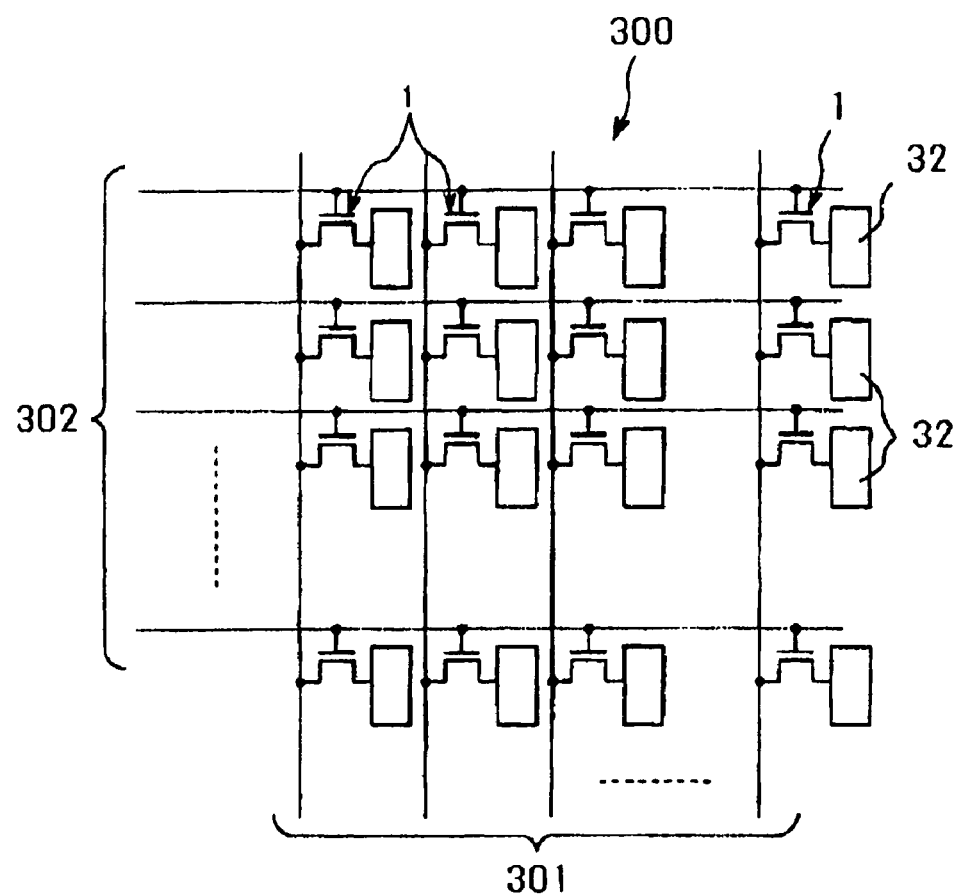
FIG. 7 is a block diagram illustrating the configuration of an active matrix device.

FIG. 6 is a longitudinal sectional view illustrating an embodiment of an electrophoretic display, and FIG. 7 is a block diagram illustrating an active matrix device that the electrophoretic display includes.

Note that, in the following description, the upper side and the lower side in FIGS. 6 and 7 are referred to as "upper" and "lower", respectively, for ease of explanation.

An electrophoretic display 20 illustrated in FIG. 6 includes an electrophoretic display sheet (front plane) 21, a circuit substrate (back plane) 22, and a sealing part 36 that airtightly seals a gap between the electrophoretic display sheet 21 and the circuit substrate 22.

The electrophoretic display sheet 21 includes a substrate 39 that has a flat-plate base 31 and a second electrode 33 provided on a surface underneath the base 31, and a microcapsule-containing layer 400 that is provided on a side of the lower surface (one surface) of the substrate 39 and is composed of microcapsules 40 and a binder material 41.

On the other hand, the circuit substrate 22 includes an opposing substrate 38 that has a flat-plate base 30 and a plurality of first electrodes 32 provided on the top surface of the base 30, and an active matrix device 300 (coupled by the first electrodes 32) provided on the opposing substrate 38 (the base 30).

The active matrix device 300 illustrated in FIG. 7 includes a plurality of data lines 301 each orthogonal to each other, a plurality of scan lines 302, and the semiconductor devices 1 each provided around each intersection of the data line 301 and the scan line 302.

The semiconductor device 1 includes the gate 7 coupled to the scan line 302, the source 3 coupled to the data line 301, and the drain 4 coupled to the pixel electrode (first electrode) 32 to be described later.

Sealed in each capsule 40 is an electrophoretic dispersion liquid 37 containing a plurality of kinds of electrophoretic particles that differ in characteristics, two kinds of electrophoretic particles 34a and 34b that differ in electric charge and color (hue) in the present embodiment, and a liquid-phase dispersion medium 35.

Hereinbelow, the structure of each element will be described.

The bases 30 and 31 are each made of a sheet (flat-plate) member and have functions of supporting and protecting members arranged therebetween.

The bases 30 and 31 may be either flexible or hard, but preferably flexible.

Using the flexible bases 30 and 31 allows achievement of the flexible electrophoretic display 20, that is, the electrophoretic display 20 useful, e.g., for constructing electronic paper.

If the bases (base material layers) 30 and 31 are to be flexible, examples of their materials include polyethylene, polypropylene, polyolefin such as ethylene-vinyl acetate copolymers, modified polyolefin, polyamide (e.g., nylon 6, nylon 46, nylon 66, nylon 610, nylon 612, nylon 11, nylon 12, nylon 6-12, and nylon 6-66), thermoplastic polyimide, liquid crystal polymers such as aromatic polyester, polyphenylene oxide, polyphenylene sulfide, polycarbonate, poly-methyl methacrylate, polyether, polyether ether ketone, polyetherimide, polyacetal, and various kinds of thermoplastic elastomers such as styrene-based, polyolefin-based, polyvinyl chloride-based, polyurethane-based, polyester-based, polyamide-based, polybutadiene-based, trans-polyisoprene-based, fluororubber-based, and chlorinated polyethylene-based thermoplastic elastomers, or copolymers, blends, and polymer alloys mainly composed of the above-listed materials.

One kind of these materials may be used alone, or two or more kinds of the materials may be used in combination.

The average thickness of each of the bases 30 and 31 as mentioned above is suitably set in accordance with the constituent material and the application, and is not particularly limited.

In the case of a flexible base, the average thickness is preferably from about 20 to about 500 μm, and more preferably from about 25 to about 250 μm.

This makes it possible to reduce the size (in particular, to reduce the thickness) of the electrophoretic display 20 while achieving the harmony between the bendability and the strength.

The first electrodes 32 and the second electrode 33 in layer states (film states) are disposed on surfaces on sides near the microcapsules 40 of the bases 30 and 31, that is, on the upper surface of the base 30 and on the lower surface of the base 31, respectively.

If an electric voltage is applied between the first electrodes 32 and the second electrode 33, an electric field is generated between them, and this electric field acts on the electrophoretic particles (display particles) 34a and 34b.

In the embodiment, the second electrode 33 is constituted as a common electrode and the first electrodes 32 are constituted as individual electrodes divided in a matrix (pixel electrode coupled to a switching element), and a portion where one second electrode 33 is positioned over one first electrode 32 constitutes one pixel.

Note that, like the first electrodes 32, the second electrode 33 may be divided into a plurality of electrodes.

Alternatively, the first electrode 32 and the second electrode 33 may be similarly divided into stripes so that the stripes of the both electrodes intersect each other.

The constituent materials of the electrodes 32 and 33 are not particularly limited if they substantially have conductivity.

As the materials, various conductive materials are mentioned.

Examples of such various conductive materials include metal materials, such as copper, aluminum, nickel, cobalt, platinum, gold, silver, molybdenum, and tantalum, or alloys containing these metals; carbon materials such as carbon black, carbon nanotube, and fullerene; electron conductive polymer materials such as polyacetylene, polypyrrole, polythiophene, polyaniline, poly(p-phenylene), poly(p-phenylene vinylene), polyfluorene, polycarbazole, and polysilane, or derivatives of these materials; ionic conductive polymer materials in which ionic substances such as NaCl, $LiClO_4$, KCl, $H_2O$, LiCl, LiBr, LiI, $LiNO_3$, LiSCN, $LiCF_3SO_3$, NaBr, NaI, NaSCN, $NaClO_4$, $NaCF_3SO_3$, KI, KSCN, $KClO_4$, $KCF_3SO_3$, $NH_4I$, $NH_4SCN$, $NH_4ClO_4$, $NH_4CF_3SO_3$, $MgCl_2$, $MgBr_2$, $MgI_2$, $Mg(NO_3)_2$, $MgSCN_2$, $Mg(CF_3SO_3)_2$, $ZnCl_2$, $ZnI_2$, $ZnSCN_2$, $Zn(ClO_4)_2$, $Zn(CF_3SO_3)_2$, $CuCl_2$, $CuI_2$, $CuSCN_2$, $Cu(ClO_4)_2$, and $Cu(CF_3SO_3)_2$ are dispersed into matrix resins such as polyvinyl alcohol, polycarbonate, polyethylene oxide, polyvinyl butyral, polyvinyl carbazole, and vinyl acetate; and conductive oxide materials such as an ITO, a fluorine-doped tin oxide (FTO), a tin oxide ($SnO_2$), and an indium oxide (IO).

One kind of the above-listed materials may be used alone, or two or more kinds of the materials may be used in combination.

In addition to the above-listed materials, various composite materials in which conductive materials (conductive particles) such as gold, silver, nickel, and carbon are mixed into non-conductive materials such as glass materials, rubber materials, and polymeric materials for adding conductivity may be used as the constituent materials of the electrodes 32 and 33.

Specific examples of such composite materials include conductive rubber in which conductive materials are mixed into rubber materials; conductive adhesives or conductive pastes in which conductive materials are mixed into epoxy-based, urethan-based, and acrylic-based adhesive compositions; and conductive resins in which conductive materials are mixed into matrix resins such as polyolefin, polyvinyl chloride, polystyrene, an acrylnitrile-butadiene-styrene copolymer (ABS) resin, nylon (polyamide), an ethylene-vinyl acetate copolymer, polyester, an acrylic resin, an epoxy resin, and a polyurethane resin.

The average thickness of each of such bases 30 and 31 is suitably set in accordance with the constituent material and the application, and is not particularly limited.

The average thickness is preferably from about 0.05 to about 10 µm, and more preferably from about 0.05 to about 5 µm.

Note that the base and the electrode arranged on the display side of the bases 30 and 31 and the electrodes 32 and 33 have optical transparency.

That is, they are substantially transparent (hyaline, colored and transparent, or translucent).

This makes it possible to visually recognize with ease the states of the electrophoretic particles 34a and 34b in the electrophoretic dispersion liquid 37 to be described later, that is, the information displayed on the electrophoretic display 20.

Note that although each of the electrodes 32 and 33 is an electrode having a monolayer structure where a single one of materials as listed above is layered, it also may be a multilayer stacked structure where a plurality of materials are layered one atop another.

For example, each of the electrodes 32 and 33 may be of one-layer structure made of an ITO, and may also be of two-layer structure consisting of an ITO layer and a polyaniline layer.

In the electrophoretic display sheet 21, the microcapsule-containing layer 400 is provided in contact with the lower surface of the second electrode 33.

The microcapsule-containing layer 400 includes a plurality of microcapsules 40, each of which includes an electrophoretic dispersion liquid 37 encapsulated in a capsule body (capsule shell) 401.

The microcapsules 40 are fixed (maintained) by the binder material 41.

The microcapsules 40 are disposed in a single layer to be arranged in a line in parallel to and between the opposing substrate 38 and the substrate 39.

In the embodiment, the microcapsules 40 are sandwiched by the first electrodes 32 and the second electrode 33 to be vertically compressed.

Each of the microcapsules 40 therefore expands horizontally to be flat-shaped.

In other words, the microcapsules 40 have a stone-wall structure as viewed from a plane.

Such a structure increases the effective display area and causes good contrast in the electrophoretic display 20.

The structure also makes it possible to reduce the vertical migration distance of the electrophoretic particles 34a and 34b.

Therefore, the electrophoretic particles 34a and 34b can migrate and gather in the vicinity of a predetermined electrode for a short time.

This also allows improvement in response speed.

In the embodiment, one microcapsule 40 is assigned to two first electrodes 32 adjacent to each other.

That is, one microcapsule 40 is arranged to lie across the two first electrodes 32.

Examples of constituent materials of the capsule body (capsule shell) 401 include gelatin, composite materials of gum arabic and gelatin, and various resin materials such as a polyurethane resin, a melamine resin, a urea resin, polyamide, and polyether.

One kind of these materials may be used alone, or two or more kinds of the materials may be used in combination.

Crosslinking (three-dimensionally crosslinking) may be made by a crosslinker in a constituent material of the capsule body 401.

This makes it possible to improve the strength while keeping the flexibility of the capsule body 401.

As a result, the microcapsule 40 is prevented from easily collapsing.

The sizes of such microcapsules 40 are preferably substantially uniform.

This makes it possible to prevent or reduce display irregularity in the electrophoretic display 20, so that the electrophoretic display 20 has more excellent display performance.

The electrophoretic dispersion liquid 37 encapsulated in the capsule body 401 contains at least one kind of electrophoretic particles 34a and 34b dispersed (suspended) into the liquid-phase dispersion medium 35.

Any electrophoretic particles 34a and 34b may be used if they are particles (charged particles) that have electric charges and electrophoresis of which can be performed in the liquid-phase dispersion medium 35 by action of an electric field.

There is no particular limitation to the electrophoretic particles 34a and 34b, but at least one kind of pigment particles and resin particles, and composite particles of these particles is preferably used.

These kinds of particles have advantages in that their manufacturing is easy and that electric charges can be controlled with relative ease.

Examples of pigments that constitute the pigment particles include black pigments such as aniline black, carbon black, and titanium black pigements; white pigments such as titanium oxide, antimony oxide, barium sulfate, zinc sulfide, zinc white, silicon oxide, and aluminum oxide pigments; yellow pigments including azo pigments, such as monoazo, disazo, and polyazo pigments, isoindolinone, chrome yellow, yellow oxide, cadmium yellow, titan yellow, and antimony; red pigments including azo pigments, such as monoazo, disazo, and polyazo pigments, quinacridone red pigments, and chrome vermilion pigments; blue pigments such as phthalocyanine blue, indanthrene blue, iron blue, ultramarine blue, and cobalt blue pigments; and green pigments such as phthalocyanine green pigment.

One kind of these pigments may be used alone, or two or more kinds of the pigments may be used in combination.

Examples of resin materials constituting resin particles include acrylic resins, polyurethane resins, urea resins, epoxy resins, polystyrene, and polyester. One kind of these materials may be used alone, or two or more kinds of the materials may be used in combination.

Examples of composite particles include pigment particles having the surfaces thereof coated with resin materials and other pigments, resin particles having the surfaces thereof coated with pigments, and particles made of mixtures in which pigments and resin materials are mixed in arbitrary composition ratios.

As the pigment particles having the surfaces thereof coated with other pigments, titanium oxide particles having the surfaces thereof coated with a silicon oxide and an aluminum oxide can be exemplified. Such particles are preferably used as white particles (electrophoretic particles 34a).

Carbon black particles or the particles having the coated surfaces thereof are preferably used as colored particles (electrophoretic particles 34b).

The shapes of the electrophoretic particles 34a and 34b are not particularly limited, but are preferably spherical.

The average particle size of the electrophoretic particles 34a and 34b is preferably from about 0.1 to about 10 µm, and more preferably from about 0.1 to about 7.5 µm.

Setting the average particle of the electrophoretic particles 34a and 34b in the foregoing range ensures that the electrophoretic particles 34a and 34b are prevented from aggregating with each other and sedimenting in the liquid-phase dispersion medium 35.

As a result, it is possible to preferably prevent the display quality of the electrophoretic display 20 from deteriorating.

On the other hand, as the liquid-phase dispersion medium 35, one that has a low solubility to the capsule body 401 and has relatively high insulation properties is preferably used.

Such an organic dispersion medium 35 is made of a nonpolar organic material (aprotic dispersion medium) that has low polarity or substantially does not have polarity.

Examples of the liquid-phase dispersion medium 35 as mentioned above include esters such as methyl acetate, ethyl acetate, butyl acetate, and ethyl formate; ketons such as acetone, methyl ethyl ketone, diethyl ketone, methyl isobutyl ketone, methylisopropylketon, and cyclohexanone; aliphatic hydrocarbons (liquid paraffin) such as pentane, hexane, and octane; alicyclic hydrocarbons such as cyclohexane and methylcyclohexane; aromatic hydrocarbons including benzenes having a long chain alkyl group, such as benzene, toluene, xylene, hexyl benzene, heptyl benzene, octyl benzene, nonyl benzene, decyl benzene, undecyl benzene, dodecyl benzene, tridecyl benzene, and tetradecyl benzene; halogenated hydrocarbons such as methylene chloride, chloroform, carbon tetrachloride, and 1,2-dichloroethane; heteroaromatic rings such as pyridine, pyrazine, furan, pyrrole, thiophene, and methylpyrrolidone; nitrils such as acetonitrile, propionitrile, and acrylonitrile; amides such as N,N-dimethylformamide and N,N-dimethylacetamide; and carboxylate or other various oils.

These media may be used alone or as a mixture.

Among them, it is preferable that media containing benzenes having a long chain alkyl group (particularly dodecylbenzene) as the main component are preferable for the liquid-phase dispersion medium 35. The benzenes having a long chain alkyl group have relatively high boiling points, which causes reduction of volatility in room temperature.

Therefore, for example, it can be prevented that the content of the electrophoretic particles 34a and 34b and the moisture content alter because of volatility of the liquid-phase dispersion medium 35 in the manufacturing method for the electrophoretic dispersion liquid 37.

As a result, this ensures that reduction of response characteristics and display performance of the electrophoretic display 20 caused by the alteration can be prevented.

Further, various dyes such as anthraquinone dyes, azo dyes, indigoid dyes, triphenylmethane dyes, pyrazolone dyes, stilbene dyes, diphenylmethane dyes, xanthene dyes, alizarin dyes, acridine dyes, quinone imine dyes, thiazole dyes, methane dyes, nitro dyes, and nitroso dyes may be dissolved into the liquid-phase dispersion medium 35 as needed.

Such dispersion of the electrophoretic particles 34a and 34b into the liquid-phase dispersion medium 35 may be performed by a paint shaker method, a ball-mill method, a media-mill method, an ultrasonic dispersion method, a stirring dispersion method, and the like.

One kind of the methods may be used alone and two or more kinds of the methods may be used in combination.

It is preferable that the specific gravities of the electrophoretic particles 34a and 34b be set substantially equal to that of the liquid-phase dispersion medium 35.

This allows the electrophoretic particles 34a and 34b to be retained for a long time at a constant position in the liquid-phase dispersion medium 35 after an electric voltage applied between the electrodes 32 and 33 is stopped.

That is, the information displayed in the electrophoretic display 20 is retained for a long time.

The binder material 41 is supplied, e.g., for the purpose of bonding the first substrate 38 and the second substrate 39, the purpose of fixing the first substrate 38 and second substrate 39 with the microcapsules 40, and the purpose of ensuring insulating properties between the electrodes 32 and 33.

This allows improvement in durability and reliability of the electrophoretic display 20.

Resin materials that are excellent in affinity (adhesion) with the electrodes 32 and 33 as well as the capsule body 401 (microcapsule 40) and excellent in insulating properties are preferably used for the binder material 41.

As the binder material 41 as mentioned above, various resin materials can be mentioned.

Examples of the materials include thermoplastic resins such as polyethylene, chlorinated polyethylene, an ethylene-vinyl acetate copolymer, an ethylene ethyl acrylate copolymer, polypropylene, an acrylonitrile styrene (AS) resin, an acrylonitrile butadiene styrene (ABS) resin, a methyl methacrylate resin, a vinyl chloride resin, a vinyl chloride-vinyl acetate copolymer, a vinylidene chloride-vinyl chloride copolymer, a vinyl chloride-acrylic ester copolymer, a vinyl chloride-methacrylate copolymer, a vinyl chloride-acrylonitrile copolymer, an ethylene-vinyl alcohol-vinyl chloride copolymer, a propylene-vinyl chloride copolymer, a vinylidene chloride resin, a vinyl acetate resin, polyvinyl alcohol, polyvinyl formal, and a cellulosic resin; polymers such as a polyamide resin, polyacetal, polycarbonate, polybutylene terephthalate, polyethlene terephthalate, poly(phenylene oxide), polysulfone, polyamide-imide, polyaminobismaleimide, polyether sulfone, poly(phenylene sulfone), polyallylate, graft polyphenylene ether, polyether ether ketone, and polyether-imide; fluorocarbon resins such as polytetrafluoroethylene, perfluoroethylene-propylene, a tetrafluoroethylene-perfluoroalkoxy vinyl ether copolymer, an ethylene-tetrafluoroethylene copolymer, polyvinylidene difluoride, polytrifluorochloroethylene, and fluororubber; silicone-based resins such as a silicone resin and silicone rubber; urethan-based resins such as polyurethane; and other resin materials such as a methaerylate-styrene copolymer, polybutene, and a methacrylate-butadiene-styrene copolymer.

One kind of these materials may be used alone and two or more kinds of the materials may be used in combination.

It is preferable that the dielectric constant of the binder material be set substantially equal to that of the foregoing liquid-phase dispersion medium 35.

Therefore, it is preferable that a material for adjusting the dielectric constant be added into the binder material 41.

Examples of the adjusting material include alcohols such as 1,2-butanediol and 1,4-butanediol, ketones, and carboxylate.

The sealing part 36 is provided between the bases 30 and 31 and along the ends thereof.

The electrodes 32 and 33 and the microcapsule-containing layer 400 are airtightly sealed by the sealing part 36.

This make it possible to prevent moisture from entering into the electrophoretic display 20.

The display performance of the electrophoretic display 20 can be prevented from deteriorating with more reliability.

As the constituent materials for the sealing part 36, various resin materials including thermoplastic resins such as acrylic resins, urethane resins, and orefin resins, and thermosetting resins such as epoxy resins, melamine resins, and phenolic resins are mentioned.

One kind of these materials may be used alone and two or more kinds of the materials may be used in combination.

Note that the sealing part 36 may be provided as needed, and may be omitted.

In the electrophoretic display 20 as described above, when a selection signal (selection voltage) is applied one or a plurality of scan lines 302, the semiconductor device 1 coupled to the scan line 302 to which the selection signal is supplied turns on.

This causes the data line 301 and the pixel electrode 32 coupled to the semiconductor device 1 to substantially conduct the electricity.

At this point, if desired data (voltage) is supplied to the data line 301, the data (voltage) is supplied to the pixel electrode 32.

This causes an electric field between the pixel electrode 32 and the second electrode 33.

The electrophoretic particles 34a and 34b are electrophoresed toward any one of the electrodes in accordance with the direction, strength of the electric field and characteristics of the electrophoretic particles 34a and 34b.

On the other hand, when the supply of a selection signal (selection voltage) to the scan line 302 is stopped, the semiconductor device 1 turns off.

This causes the data line 301 and the pixel electrode 32 coupled to the semiconductor device 1 not to conduct the electricity.

Therefore, with an appropriate combination of the supply and stoppage of a selection signal to the scan line 302 and the supply and stoppage of data to the data line 301, a desired image (information) can be displayed on a side of the electrophoretic display sheet 21 (a side of the second electrode 33) of the electrophoretic display 20.

Particularly, in the electrophoretic display 20 of the embodiment, the electrophoretic particles 34a and 34b differ in color, allowing a multi-gradation image to be displayed.

The electrophoretic display 20 of the embodiment can selectively turn on/off the semiconductor device 1 coupled to a particular scan line 302 because of having the active matrix device 300.

This is unlikely to cause a cross-talk problem and allows an increase in speed of circuit operations.

It is therefore possible to obtain a high quality image (information).

The electropthoretic display 20 of the embodiment operates at a low drive voltage, allowing reduction in power consumption.

It is to be understood that a method for manufacturing such an electro-optical device as described above is not particularly limited if it includes a method for manufacturing a semiconductor device of one embodiment of the invention, and any publicly-known method may be used.

For example, the manufacturing may be performed by the following method.

(2) Method for Manufacturing Electrophoretic Display

FIGS. 8A to 9F are schematic views for illustrating a method for manufacturing an electrophoretic display illustrated in FIG. 6.

Note that, in the following description, the upper side and the lower side in FIGS. 8A to 9F are referred to as "upper" and "lower", respectively.

[C1] Fabrication Process of Microcapsules 40

First, the microcapsules 40 in which the electrophoretic dispersion liquid 37 is encapsulated are fabricated.

The technique of preparing the microcapsules 40 (the method for encapsulating the electrophoretic dispersion liquid 337 into the capsule body 401) is not particularly limited.

For example, various microcapsule preparation methods such as an interfacial polymerization method, an in-situ polymerization method, a phase separation method, an interfacial precipitation method, and a spray-drying method may be used.

The microcapsules 40 having a uniform size can be obtained, e.g., by using sifting for selection, filtration, and classification according to specific gravity.

The average particle size of the microcapsules 40 is preferably from about 20 to about 200 μm, and more preferably from about 30 to about 100 μm.

Setting the average particle size of the microcapsules 40 in the foregoing range makes it possible to control electrophoresis of the electrophoretic particles 34a and 34b with more reliability in the manufactured electrophoretic display 20.

[C2] Preparation Process of Microcapsule Dispersion Liquid

Next, a microcapsule dispersion liquid containing the microcapsules 40 fabricated as described above, the binder material 41, and a dispersion medium is prepared.

As the dispersion medium, a solvent (aqueous solvent) having high hydrophilicity (i.e., low hydrophobicity) is preferable.

Specific examples of the aqueous solvent include water such as distilled water and pure water; and lower alcohols such as methanol, ethanol, isopropanol, and butanol.

Among these solvents, water is particularly preferable.

Substituents having low hydrophobicity such as a methoxy group may be introduced into lower alcohols.

The use of an aqueous solvent as mentioned above suppresses penetration of the medium to the microcapsules 40.

This prevents swelling and dissolution of the microcapsules 40 caused by penetration of the solvent with more reliability.

The concentration (content) of the binder material 41 in the microcapsule dispersion liquid excluding the microcapsules 40 is preferably 50 wt % or less, and more preferably from about 0.05 to about 25 wt %.

Setting the concentration of the binder material 41 to the foregoing value allows the viscosity of the microcapsule dispersion liquid to be a preferable value.

This makes it possible to move the microcapsules 40 easily and reliably in a process of supplying a microcapsule dispersion liquid to fill gaps between the microcapsules 40, which will be described later.

The viscosity of a microcapsule dispersion liquid is preferably from about 1 to about 1000 cP (25° C.), and more preferably from about 2 to about 700 cP (25° C.).

The content of the microcapsules 40 of a microcapsule dispersion liquid is preferably from about 10 to about 80 wt %, and more preferably from about 30 to about 60 wt %.

Setting the content of the microcapsules 40 in the foregoing range is very advantageous in arranging the microcapsules 40 to move (rearrange) them in the microcapsule-containing layer 400 so that the microcapsules 40 do not overlap one another (in a single layer) in the thickness direction.

[C3] Formation Process of Microcapsule-Containing Layer

Next, the substrate 39 as illustrated in FIG. 5A is prepared.

Figure 8A:
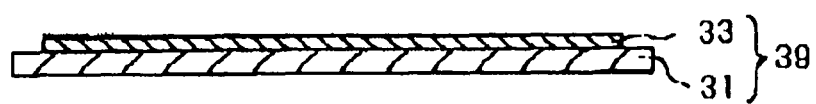
FIGS. 8A to 8D are schematic views for explaining a manufacturing method for the electrophoretic display illustrated in FIG. 6.
Figure 8B:
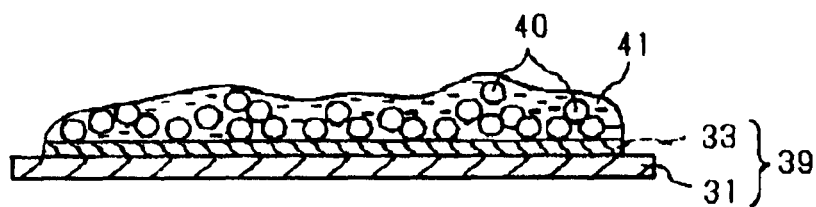

As illustrated in FIG. 8B, a microcapsule dispersion liquid is supplied onto the substrate 39.

As the method for supplying a microcapsule dispersion liquid, various coating methods such as a spin-coating method, a dip-coating method, and a spray-coating method may be used.

Next, the microcapsule dispersion liquid is smoothed, as required, so as to make its thickness (volume) even in every portion on the substrate 39, and preferably to arrange the microcapsules 40 one by one (in a single layer) not to overlap one another in the thickness direction.

Figure 8C:
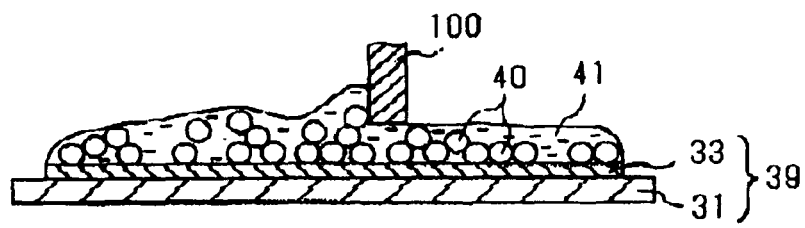

This can be performed, e.g., by making a squeegee (flat plate jig) 100 pass through on the substrate 39 to sweep the microcapsules 40 as illustrated in FIG. 8C.

Figure 8D:
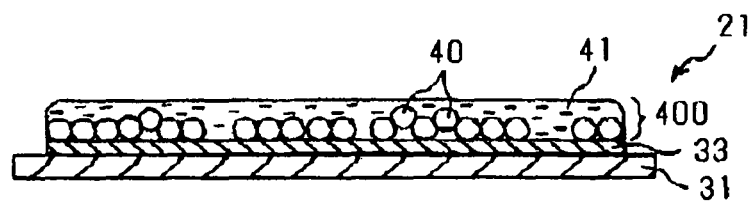

As a result, the microcapsule-containing layer 400 is formed, and thus the electrophoretic display sheet 21 as illustrated in FIG. 8D is obtained.

[C4] Bonding Process of Circuit Substrate 22

Figure 9A:
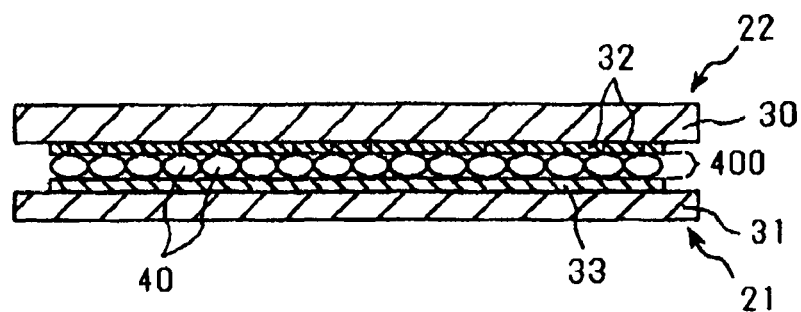
FIGS. 9A and 9B are schematic views for explaining a manufacturing method for the electrophoretic display illustrated in FIG. 6.
Figure 9B:
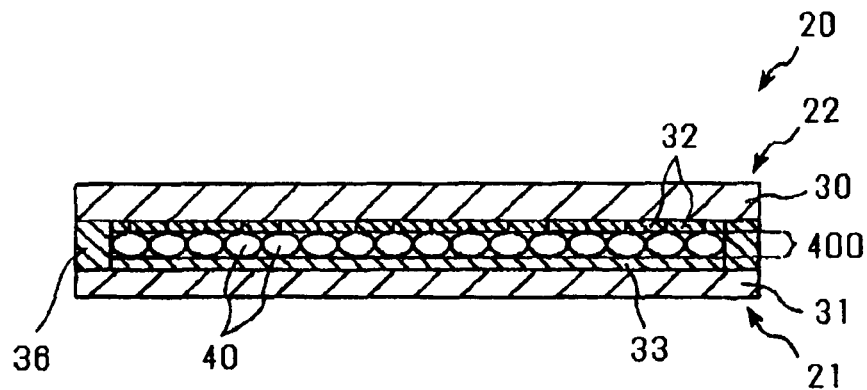

Next, as illustrated in FIG. 9E, the circuit substrate 22, the first electrode 32 of which is coupled to an active matrix device including a semiconductor device manufactured by the aforementioned manufacturing method for a semiconductor device of one embodiment of the invention, is placed over the microcapsule-containing layer 400 in such a manner that the first electrode 32 is brought into contact with the microcapsule-containing layer 400.

In this way, the electrophoretic display sheet 21 and the circuit substrate 22 are bonded with the microcapsule-containing layer 400 interposed therebetween.

[C5] Sealing Process

Next, as illustrated in FIG. 9F, the sealing part 36 is formed along ends of the electrophoretic display sheet 21 and the circuit substrate 22.

This part is positioned between the electrophoretic display sheet 21 (the base 31) and the circuit substrate 22 (the base 30).

A material for forming the sealing part 36 is supplied along ends of these sheet and substrate, e.g., by a dispenser, and is solidified or cured, thereby allowing the part to be formed.

The electrophoretic display 20 is thus obtained through the above-described processes.

Electronic Apparatus

Next, an electronic apparatus including a semiconductor device of one embodiment of the invention will be described.

Examples of an electronic apparatus of one embodiment of the invention include personal computers (mobile personal computers), cellular phones, and digital still cameras, and in addition to those apparatuses, televisions (TVs), video cameras, viewfinder type or monitor-direct-view-type video tape recorders, laptop personal computers, car navigation devices, pagers, electronic notebooks (including ones with communication functions), electronic dictionaries, electronic calculators, electronic game machines, word processors, work stations, TV phones, security TV monitors, electronic binoculars, point-of-sale (POS) terminals, apparatuses equipped with touch panels (e.g., cash dispensers in financial institutions and automatic ticket vending machines), medical equipment (e.g., electronic clinical thermometers, sphygmomanometers, blood glucose sensors, electrocardiograph (ECG), ultrasonic diagnostic equipment, display devices for endoscopes), fish finders, various measuring equipment, gauges (e.g., gauges for vehicles, aircrafts, and ships), flight simulators, other various monitors, and projection display devices such as projectors.

(1) Electronic Paper

Figure 10:
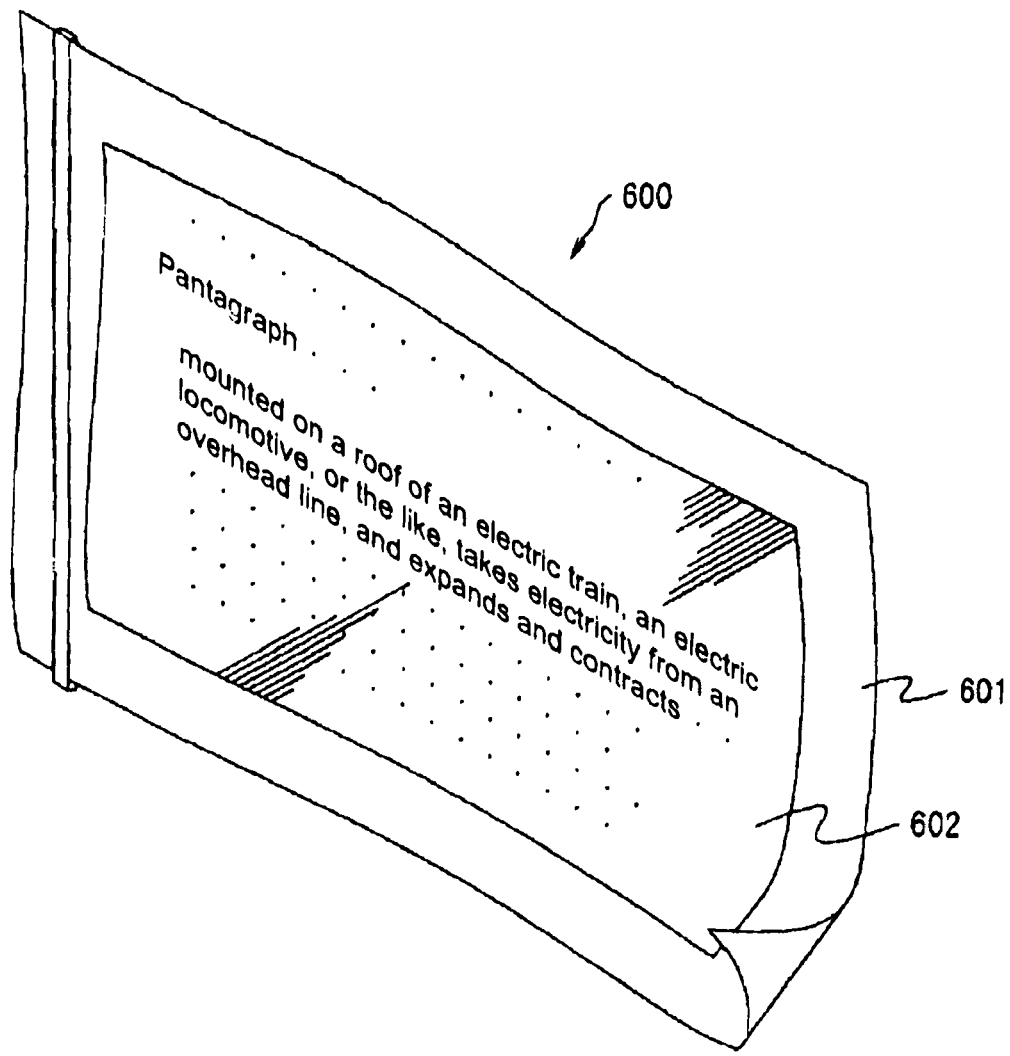
FIG. 10 schematically illustrates electronic paper that is an embodiment of an electronic apparatus of the invention.

FIG. 10 is a perspective view illustrating electronic paper that is an electronic apparatus of one embodiment of the invention.

Electronic paper 600 illustrated in the figure includes a body 601 composed of a rewritable sheet having the same texture and flexibility as paper, and a display unit 602.

In this electronic paper 600, the display unit 602 is formed of the above-described electrophoretic display 20.

A method for manufacturing such electronic paper is not particularly limited if it includes a manufacturing method for a semiconductor device of one embodiment of the invention or includes a manufacturing method for an electro-optical device including the manufacturing method for a semiconductor device of one embodiment of the invention, and any publicly known methods may be used.

(2) Display

Figure 11A:
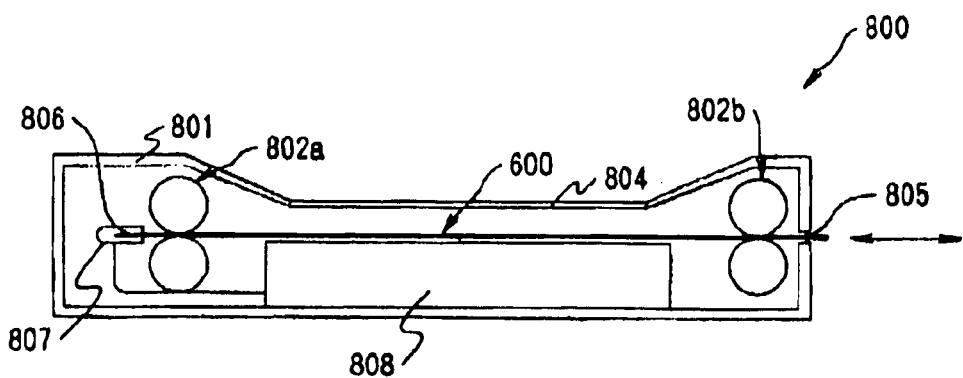
FIGS. 11A and 11B schematically illustrate a display that is an embodiment of an electronic apparatus of the invention.
Figure 11B:
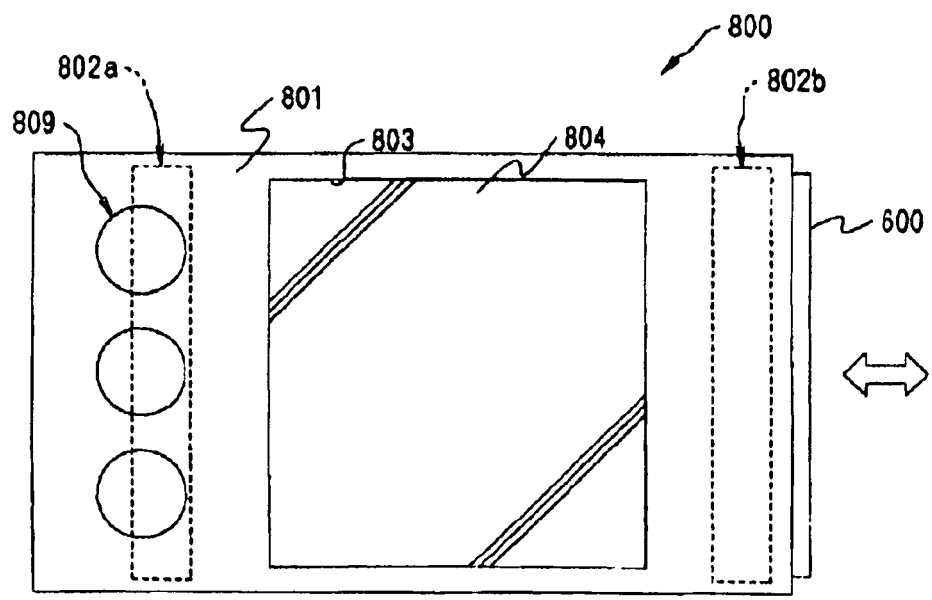

FIGS. 11A and 11B illustrate a display that is an electronic apparatus of one embodiment of the invention, and FIG. 11A is a sectional view and FIG. 11B is a plan view.

A display 800 illustrated in the figure includes a body 801 and electronic paper 600 detachably placed to the body 801.

Note that the electronic paper 600 has a structure as described above, that is, the same structure as illustrated in FIG. 10.

An insertion opening 805 to which the electronic paper 600 can be inserted is formed in a side portion (on the right side in the figure) of the body 801, and two pairs of transport roller pairs 802*a* and 802*b* are provided inside the body 801.

When the electronic paper 600 is inserted through the insertion opening 805 into the body 801, the electronic paper 600 is placed in the body 801 in a state of being sandwiched by the transport roller pairs 802*a* and 802*b*.

Formed on the display surface side of the body 801 (front side of the page space in FIG. 11B) is a rectangular hole 803, in which a transparent glass plate 804 is fitted.

Through the glass plate, the electronic paper 600 being placed in the body 801 can be visually observed from the outside of the body 801.

That is, in the display 800, the electronic paper 600 being placed in the body 801 is visually observed in the transparent glass plate 804, thereby making the display surface.

A terminal 806 is placed at a tip (left side in the figure) in the insertion direction of the electronic paper 600, and a socket 807 to which the terminal 806 is connected with the electronic paper 600 being placed in the body 801 is provided inside the body 801.

A controller 808 and operation parts 809 are electrically coupled to the socket 807.

In this display 800, the electronic paper 600 is detachably placed on the body 801, and therefore may be used in a state of being detached from the body 801.

In this display 800, the electronic paper 600 is formed of the above-described electrophoretic display 20.

This display 800 using a semiconductor device of one embodiment of the invention as the active matrix device leads to improvement in aperture ratio of a display, and thus is preferable.

A method for manufacturing this display 800 is not particularly limited if it includes a manufacturing method for a semiconductor device of one embodiment of the invention or includes a manufacturing method for an electro-optical device including the manufacturing method for a semiconductor device of one embodiment of the invention, and any publicly known methods may be used.

Hereinbefore, a semiconductor device, a manufacturing method therefor, and an electro-optical device and an electronic apparatus including this device of embodiments of the invention are described, but the invention is not limited to those described above.

Note that, in a semiconductor device of one embodiment of the invention, a layer having an arbitrary object may be provided between layers.

The structure of the semiconductor device is not particularly limited and may be bottom-gate type, top-gate type, etc.

A manufacturing method for a semiconductor device of one embodiment of the invention may include any other processes, such as a process of forming a gate insulating layer on a substrate and a process of removing a mask, if they have effects of the invention.

First Reference Example

First, the relationship of the film thickness and resistivity of an IZO was examined.

IZO films having different film thicknesses (1, 2, 5, 8, 20, 50, 105, and 500 nm) were formed on glass substrates by a sputtering method.

Using these substrates, the sheet resistances were measured by a four point probe sheet resistance measurement system including a constant current power supply (made by Keythley Instruments Inc.) and a micro voltmeter (made by Keythley Instruments Inc.).

From the resulting values and the film thicknesses, the resistivities (sheet resistance×film thickness) were obtained.

Figure 12:
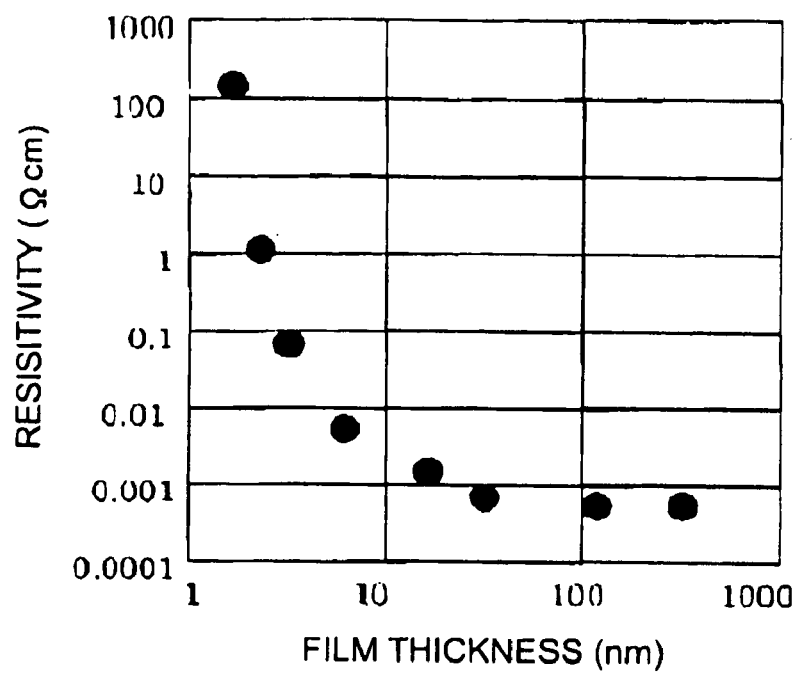
FIG. 12 is a graph illustrating the relationship between the film thickness and the resistivity of an indium zinc complex oxide (IZO).

The results are illustrated in FIG. 12.

Note that the film thicknesses were obtained by conversion from sputtering time, not from actual measurement.

The sputtering method was performed under conditions as follows: sputtering time, 0.1, 0.2, 0.5, 0.8, 2, 5, 10.5, and 50 minutes; the distance between a sputtering target and a mask, 10 cm; a substrate temperature, 100° C.; argon flow rate, 120 sccm; and oxygen flow rate, 0.5 sccm.

As illustrated in FIG. 12, it was found that the dependency of the resistivity to the film thickness was small in IZO films having film thicknesses of 50 nm or more, and was little in those having film thicknesses of 100 nm or more.

It was also found, on the other hand, that the resistivity increased as the film thickness decreased in IZO films having film thicknesses of 20 nm or less, and the resistivity sharply increased in those having film thicknesses of 10 nm or less.

Consequently, it was found that the smaller the film thickness was, the more IZO exhibited semiconductor properties.

Second Reference Example

The voltage-to-current characteristics (V-I characteristics) of IZO films were examined.

IZO films having film thicknesses of 5, 10, and 20 nm were formed by a sputtering method.

Using the substrates with these films, an electric current was swept with the use of a four point probe I-V measurement system including a constant current power supply (made by Keythley Instruments Inc.) and a micro voltmeter (made by Keythley Instruments Inc.).

The I-V characteristics were thus obtained.

Note that the conditions of the sputtering method are the same as those in the first reference example.

Figure 13:
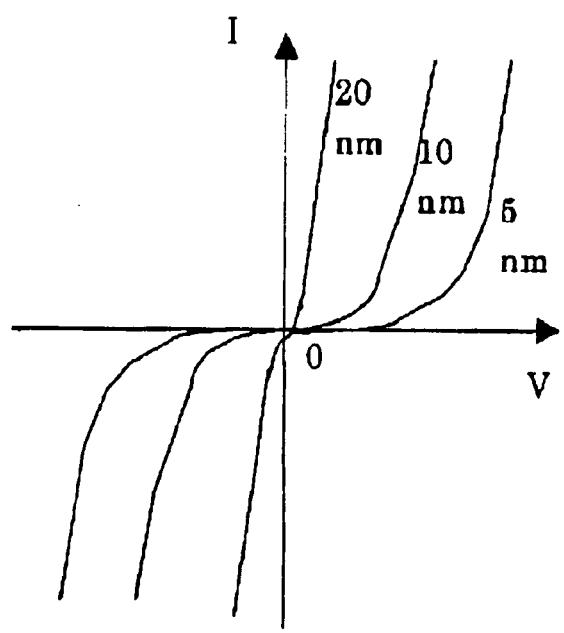
FIG. 13 is a graph illustrating the relationship of voltage-to-current characteristics of an IZO film.

The results are illustrated in FIG. 13.

As illustrated in FIG. 13, it was found that the smaller the film thickness was, the more the IZO had non-linear characteristics.

In the case of a film thickness of 20 nm, the IZO had nearly linear characteristics.

Consequently, it was found that the smaller the film thickness was, the more the IZO exhibited semiconductor properties.

Third Reference Example

Examination was performed in the same way as in the first and second reference examples, excepting that the IZO is replaced by an ITO.

The resulting relationship of the film thickness and resistivity and the I-V characteristics of the IZO were the same as those of the ITO.

EXAMPLES

First Example

<1> First, a glass substrate with an ITO film having a thickness of 0.5 mm was prepared.

<2> Next, a silicon dioxide was deposited to provide a layer having a thickness of 400 nm on the substrate by a sputtering method, thereby forming a gate insulating layer.

<3> Next, with a mask illustrated in FIG. 2 placed on the gate insulating layer, an IZO was deposited to provide a layer by a sputtering method.

The specifications of the mask were as follows: the plate, L: 20 mm, W: 20 mm, H: 2 mm; the opening, $l_1$: 10 mm, $w_1$: 10 mm; the bar, $l_2$: 14 mm, r: 80 µm; and the recess, $l_3$: 1500 µm, $w_2$: 80 µm, d: 80 µm.

The sputtering method was performed for a sputtering time of 10.5 minutes.

As a result of measuring the film thickness of the IZO layer, the film thickness was 5 nm in the thinnest part and 100 nm in the opening due to the roundabout effect of the IZO in the partition portion.

Thus, an IZO layer having a source, a drain, and a channel integrally formed therein was obtained.

As described above, a thin film transistor was obtained.

<4> Using the ITO as a gate electrode, a source of the IZO layer as a source electrode, and a drain as a drain electrode in the obtained thin film transistor, the field effect transistor characteristics were evaluated using a direct-current voltage-current source/monitor (made by Advantest Corporation).

Figure 14:
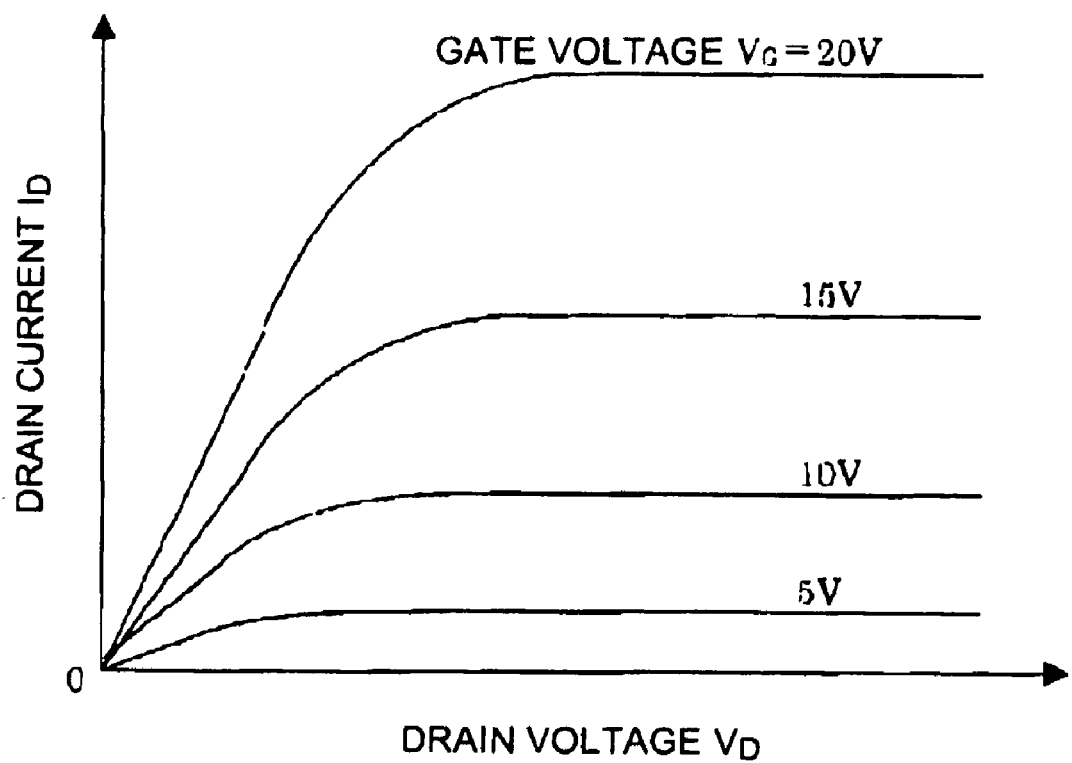
FIG. 14 is a graph illustrating the field effect transistor output characteristics of a transparent transistor.

The results are illustrated in FIG. 14.

FIG. 14 illustrates the output characteristics of the field effect transistor.

As illustrated in FIG. 14, an extremely-thin IZO portion was modulated because of field effect and therefore functioned as a channel.

Good n-type field effect transistor characteristics were able to be obtained.

The results correspond to the relationship demonstrated in the reference examples.

Second Example

Processes were performed in the same way as in the first example, excepting that an ITO is used instead of the IZO.

As a result, excellent n-type field effect transistor characteristics were able to be obtained in the case of using ITO.

The results correspond to the relationship demonstrated in the reference examples.

Third Example

Two kinds of thin film transistors with channels having thicknesses 10 nm and 5 nm were manufactured.

In the <3> process of the first example, with masks without a bar placed on a gate insulating layer, two kinds of IZO layers having thicknesses of 4 nm and 2 nm were formed by a sputtering method.

After removing the masks, a mask illustrated in FIG. 2 was placed on each of the IZO layers and a sputtering method was applied to form IZO layers.

The channels in these IZO layers were 6 nm and 3 nm in thickness.

Thus, two kinds (10 nm and 5 nm in thickness) of thin film transistors each having two IZO layers were obtained (FIG. 4).

Note that the sources and drains each had a thickness of 100 nm.

The sputtering method was applied for 0.4 minute for forming the IZO layer having a thickness of 4 nm, and for 0.2 minute for forming the IZO layer having a thickness of 2 nm.

The method was performed for 10 minutes for forming a source and a drain each having a thickness of 100 nm.

Using the ITO as a gate electrode, a source of an IZO layer as a source electrode, and a drain as a drain electrode in each of the obtained thin film transistors, the field effect transistor characteristics were evaluated in the same way as in the first example.

As a result, good n-type field effect transistor characteristics as in the first example were able to be obtained in either of the thin film transistors.

In particular, remarkable switching effects were acknowledged in the thin film transistor having a 5 nm channel.

Consequently, it was found that the smaller the film thickness was, the more excellent characteristics were obtained, and the results corresponded to the relationship demonstrated in the reference examples.

Fourth Example

Processes were performed in the same way as in the third example, excepting that an ITO is used instead of the IZO.

As a result, like the third example, good n-type field effect transistor characteristics were able to be obtained in the case of using the ITO.

Fifth Example

Two kinds of thin film transistors with IZO layers having thicknesses 10 nm and 5 nm were manufactured.

In the <3> process of the first example, with masks illustrated in FIG. 2 placed on a gate insulating layer, IZO layers were formed by a sputtering method such that one layer had a thickness of 6 nm in the channel portion and the other layer had a thickness of 3 nm in the channel portion.

After removing the masks, a mask without a bar was placed on each of the IZO layers, and two kinds of IZO layers having thicknesses of 4 nm and 2 nm were formed by a sputtering method.

Thus, two kinds (10 nm and 5 nm in thickness) of thin film transistors each having two IZO layers were obtained (FIG. 5).

Note that the sources and drains each had a thickness of 100 nm.

The sputtering method was performed for 0.4 minute for forming the IZO layer having a thickness of 4 nm, and for 0.2 minute for forming the IZO layer having a thickness of 2 nm.

The method was performed for 10 minutes for forming a source and a drain each having a thickness of 100 nm.

Using the ITO as a gate electrode and a source and a drain of the IZO layer as a source electrode and a drain electrode, respectively, in each of the obtained thin film transistors, the field effect transistor characteristics were evaluated in the same way as in the first example.

As a result, good n-type field effect transistor characteristics as in the first example were able to be obtained in either of the thin film transistors.

In particular, remarkable switching effects were acknowledged in the thin film transistor having the 5 nm IZO layer.

Consequently, it was found that the smaller the film thickness was, the better characteristics were obtained, and the results corresponded to the relationship demonstrated in the reference examples.

Sixth Example

Processes were performed in the same way as in the fifth example, excepting that an ITO is used instead of the IZO.

As a result, like the fifth example, good n-type field effect transistor characteristics were able to be obtained in the case of using the ITO.

Comparative Example

Two kinds of thin film transistors with IZO layers having thicknesses 50 nm or 100 nm were manufactured.

Processes were performed in the same way as in the first example, excepting that an IZO is deposited to provide a layer having a thickness of 60 nm or 100 nm using a mask without a bar instead of the mask of the first example.

In this case, the IZO layer does not have a thin portion having a thickness of 5 nm, but has an even thickness of 50 nm or 100 nm.

As a result, field effect transistor characteristics were not obtained.

What is claimed is:
1. A semiconductor device, comprising:
a substrate;

a transparent oxide layer disposed on one surface side of the substrate, the transparent oxide layer including a source, a drain, and a channel formed integrally between the source and the drain, and being made of a transparent oxide material as a main material, wherein the source, the drain and the channel regions of the transparent oxide layer have substantially a same material composition and dopant density;

a gate disposed apart from the transparent oxide layer, the gate providing an electric field to the channel; and a gate insulating layer disposed between the transparent oxide layer and the gate, the gate insulating layer insulating the source and the drain from the gate, wherein an average thickness of the channel is smaller than an average thickness of the source and the drain so that the source and the drain function as a conductor and the channel functions as a semiconductor; and wherein the channel has a first surface facing the substrate and a second surface opposing the first surface, and the second surface is curved and concave, the first surface that faces the substrate is disposed directly on the gate insulating layer.

2. The semiconductor device according to claim 1, wherein A/B is from 2.5 to 4000, where the average thickness of the source and the drain is A [nm] and the average thickness of the channel is B [nm].

3. The semiconductor device according to claim 1, wherein the source and the drain have an average thickness of 50 nm or more.

4. The semiconductor device according to claim 1, wherein a distance between the source and the drain is from 0.1 to 100 μm.

5. The semiconductor device according to claim 1, wherein the channel has an average thickness of from 0.5 to 20 nm.

6. The semiconductor device according to claim 1, wherein a thickness of the channel decreases toward a central part between the source and the drain.

7. The semiconductor device according to claim 1, wherein the transparent oxide material is a metal complex oxide.

8. The semiconductor device according to claim 7, wherein the metal complex oxide is a complex oxide containing indium.

9. The semiconductor device according to claim 8, wherein the complex oxide containing indium has at least one of an indium tin complex oxide and an indium zinc complex oxide as a main component.

10. The semiconductor device according to claim 1, wherein the transparent oxide layer has a third surface facing the substrate and a fourth surface opposing the third surface, and the fourth surface is a continuous surface.

11. A method for manufacturing the semiconductor device according to claim 1, comprising:
(a) placing a mask having a first opening corresponding to the source and a second opening corresponding to the drain on one surface of the substrate; and
(b) supplying the transparent oxide material from a side facing the substrate and adjacent to the mask to form a film,
wherein, in the step (b), the source and the drain are formed and the transparent oxide material is introduced to an area directly under a partition separating the first opening from the second opening and covered with the partition to form the channel integrally with the source and the drain to obtain the transparent oxide layer.

12. The method for manufacturing the semiconductor device according to claim 11, wherein the partition has roundness in a portion thereof on a side facing the substrate.

13. The method for manufacturing the semiconductor device according to claim 11, wherein the mask includes a plate having an opening, and a bar provided to partition the opening into the first opening and the second opening.

14. The method for manufacturing the semiconductor device according to claim 13, wherein the plate includes recesses in edges of the opening, each recess receiving each end of the bar.

15. An electro-optical device comprising the semiconductor device according to claim 1.

16. An electronic apparatus comprising the electro-optical device according to claim 15.

* * * * *